United States Patent
Lim et al.

(10) Patent No.: US 12,089,408 B2
(45) Date of Patent: Sep. 10, 2024

(54) NON-VOLATILE MEMORY DEVICE INCLUDING COMMON SOURCE LINE TAPPING WIRE CONNECTED TO COMMON SOURCE LINE PLATE BY VIAS ON LOWER METAL LINE AND THROUGH-HOLE VIAS

(71) Applicant: Samsung Electronics Co., Ltd., Suwon-si (KR)

(72) Inventors: Bongsoon Lim, Seoul (KR); Hyunggon Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 209 days.

(21) Appl. No.: 17/697,386

(22) Filed: Mar. 17, 2022

(65) Prior Publication Data

US 2023/0027955 A1   Jan. 26, 2023

(30) Foreign Application Priority Data

Jul. 14, 2021   (KR) .................. 10-2021-0092379

(51) Int. Cl.
| | | |
|---|---|---|
| G11C 16/04 | (2006.01) | |
| G11C 16/06 | (2006.01) | |
| H10B 43/27 | (2023.01) | |
| H10B 43/40 | (2023.01) | |

(52) U.S. Cl.
CPC ......... *H10B 43/27* (2023.02); *G11C 16/0483* (2013.01); *G11C 16/06* (2013.01); *H10B 43/40* (2023.02)

(58) Field of Classification Search
None
See application file for complete search history.

(56) References Cited

U.S. PATENT DOCUMENTS

| | | | |
|---|---|---|---|
| 7,679,133 B2 | 3/2010 | Son et al. | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 9,515,087 B2 | 12/2016 | Son et al. | |
| 10,014,058 B2 | 7/2018 | Lee | |
| 10,522,560 B2 | 12/2019 | Lee | |

(Continued)

OTHER PUBLICATIONS

Extended European Search Report dated Sep. 26, 2022 for corresponding European Application No. 22164370.3.

*Primary Examiner* — Alfredo Bermudez Lozada
(74) *Attorney, Agent, or Firm* — Harness, Dickey & Pierce, P.L.C.

(57) ABSTRACT

A non-volatile memory device including a memory cell region over a peripheral circuit region. The memory cell region includes an upper substrate, channel structures extending in a vertical direction, and a first upper metal line extending in a first direction. The peripheral circuit region includes a first lower metal line extending in a second direction, and first and second via structures on the first lower metal line, a top surface of the second via structure in contact with the upper substrate. The memory cell region includes a first through-hole via structure passing through the upper substrate and the first via structure, and electrically connecting the first upper metal line to the first lower metal line; and the first upper metal line is electrically connected to the upper substrate through the first through-hole via structure, the first lower metal line, and the second via structure.

20 Claims, 30 Drawing Sheets

(56) References Cited

U.S. PATENT DOCUMENTS

| | | | |
|---|---|---|---|
| 10,777,571 B2 | 9/2020 | Jung et al. | |
| 10,964,710 B2 | 3/2021 | Yun et al. | |
| 10,971,210 B2 * | 4/2021 | Park | G11C 5/06 |
| 2011/0233648 A1 | 9/2011 | Seol et al. | |
| 2017/0316833 A1 * | 11/2017 | Ihm | G11C 16/0483 |
| 2020/0091164 A1 | 3/2020 | Liu | |
| 2020/0194453 A1 * | 6/2020 | Lim | H10B 43/10 |
| 2020/0373321 A1 | 11/2020 | Kwak et al. | |
| 2021/0091105 A1 | 3/2021 | Kim et al. | |

* cited by examiner

NON-VOLATILE MEMORY DEVICE INCLUDING COMMON SOURCE LINE TAPPING WIRE CONNECTED TO COMMON SOURCE LINE PLATE BY VIAS ON LOWER METAL LINE AND THROUGH-HOLE VIAS

CROSS-REFERENCE TO RELATED APPLICATION

This application is based on and claims priority under 35 U.S.C. § 119 to Korean Patent Application No. 10-2021-0092379, filed on Jul. 14, 2021, in the Korean Intellectual Property Office, the disclosure of which is incorporated by reference herein in its entirety.

BACKGROUND

The inventive concepts relate to a memory device, and more particularly, to a three-dimensional (3D) non-volatile memory device having a cell-over-periphery (COP) structure.

Memory devices are used to store data. Memory devices can be classified as volatile memory devices and non-volatile memory devices. 3D non-volatile memory devices having a memory cell array and a peripheral circuit arranged in a vertical direction have been developed in response to the demand for compact high-capacity non-volatile memory devices. There has been research into various wiring methods of applying a voltage to a plate common source line when a 3D non-volatile memory device includes the plate common source line.

SUMMARY

The inventive concepts provide a non-volatile memory device for reducing routing difficulty with respect to a plate common source line and increasing the use efficiency of memory blocks in a cell region.

According to an aspect of the inventive concepts, there is provided a non-volatile memory device including a memory cell region including an upper substrate, channel structures extending in a vertical direction on the upper substrate, and a first upper metal line extending in a first horizontal direction above the channel structures; and a peripheral circuit region below the memory cell region in the vertical direction, the peripheral circuit region including a first lower metal line extending in a second horizontal direction, a first via structure on the first lower metal line and a second via structure on the first lower metal line, a top surface of the second via structure being in contact with the upper substrate, wherein the memory cell region further includes a first through-hole via structure extending in the vertical direction, passing through the upper substrate and the first via structure, and electrically connecting the first upper metal line to the first lower metal line; and the first upper metal line is electrically connected to the upper substrate through the first through-hole via structure, the first lower metal line, and the second via structure.

According to another aspect of the inventive concepts, there is provided a non-volatile memory device including a first semiconductor layer including a plate common source line, channel structures extending in a vertical direction on the plate common source line, a common source line tapping wire extending in a first horizontal direction on the channel structures, and a first through-hole via structure passing through the plate common source line and extending in the vertical direction; and a second semiconductor layer below the first semiconductor layer in the vertical direction, the second semiconductor layer including a lower substrate, circuit elements on the lower substrate, a plurality of lower metal layers connected to the circuit elements, and a plurality of via structures on a first lower metal layer adjacent to the first semiconductor layer among the plurality of lower metal layers, the first lower metal layer extending in a second horizontal direction, wherein the first through-hole via structure electrically connects the common source line tapping wire to the first lower metal layer; and the common source line tapping wire is electrically connected to the plate common source line through the first through-hole via structure, the first lower metal layer, and the plurality of via structures.

According to a further aspect of the inventive concepts, there is provided a non-volatile memory device including a first semiconductor layer including a first memory block, a second memory block, a first through-hole via region adjacent to the first memory block, a bit line through-hole via region adjacent to the first through-hole via region, and a second through-hole via region between the bit line through-hole via region and the second memory block; and a second semiconductor layer below the first semiconductor layer in a vertical direction, the second semiconductor layer including a first lower metal line and a second lower metal line separated from the first lower metal line in a first horizontal direction, wherein the first through-hole via region includes a first through-hole via structure connecting a first upper metal line to the first lower metal line, the first upper metal line being above the first and second memory blocks and extending in the first horizontal direction; and the second through-hole via region includes a second through-hole via structure connecting the first upper metal line to the second lower metal line.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF THE EMBODIMENTS

Figure 1:
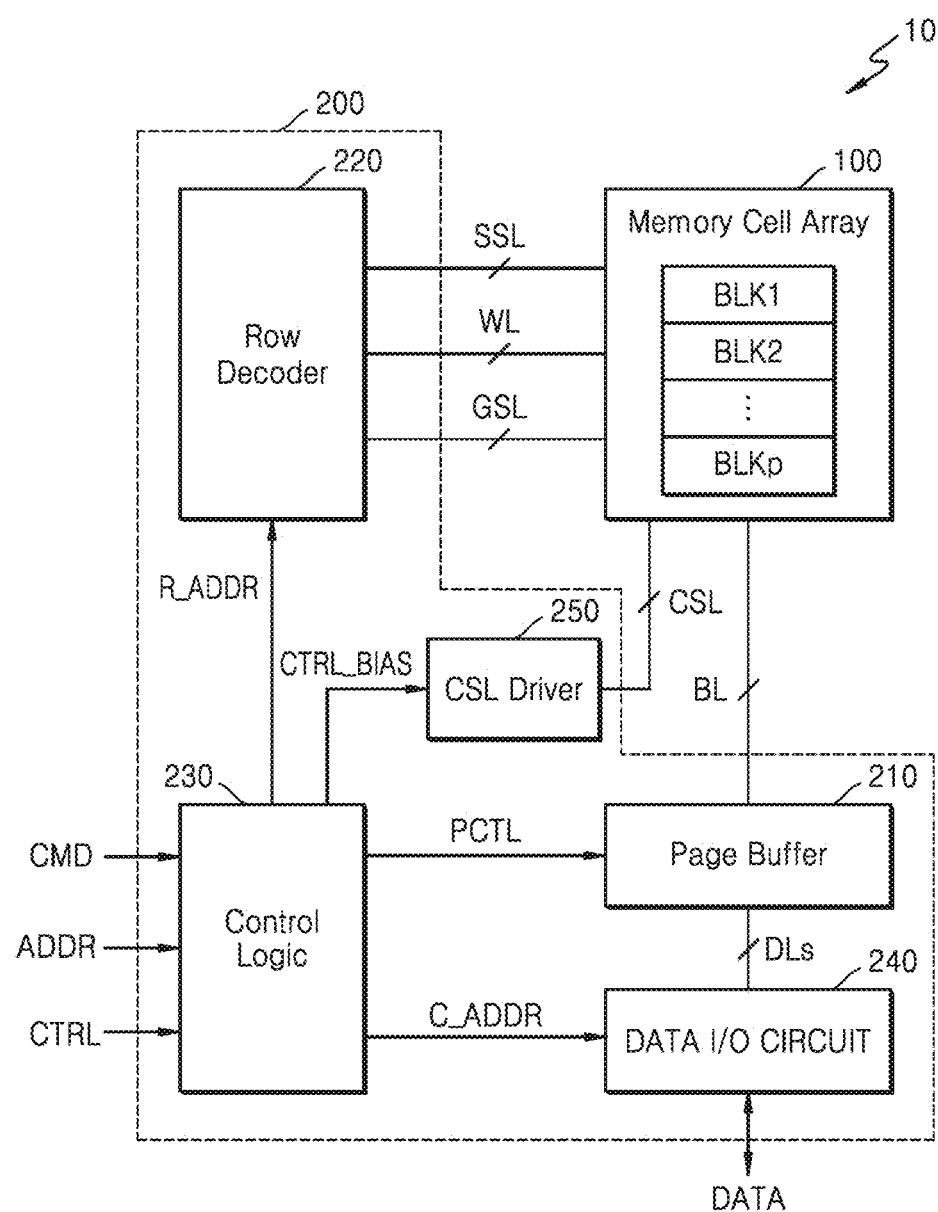
FIG. 1 is a block diagram of a memory device according to an example embodiment.

Hereinafter, embodiments will be described in detail with reference to the accompanying drawings. In the drawing, like reference characters denote like elements, and redundant descriptions thereof will be omitted.

FIG. 1 is a block diagram of a memory device 10 according to an example embodiment.

Referring to FIG. 1, the memory device 10 may include a memory cell array 100 and a peripheral circuit 200. The peripheral circuit 200 may include a page buffer 210, a row decoder 220, a control logic circuit 230, a data input/output (I/O) circuit 240, and a common source line driver 250. Although not shown in FIG. 1, the peripheral circuit 200 may further include a voltage generator, a temperature sensor, or the like. The memory device 10 herein may refer to a non-volatile memory device.

The memory cell array 100 may include a plurality of memory blocks BLK1 to BLKp (where "p" is a positive integer). Each of the memory blocks BLK1 through BLKp may include a plurality of memory cells. The memory cell array 100 may be connected to the page buffer 210 through bit lines BL and connected to the row decoder 220 through word lines WL, string selection lines SSL, and ground selection lines GSL. For example, the memory cells may include flash memory cells. Hereinafter, example embodiments will be described using the case that the memory cells are NAND flash memory cells. However, embodiments are not limited thereto. In some embodiments, the memory cells may be resistive memory cells such as resistive random access memory (ReRAM) cells, phase-change RAM (PRAM) cells, or magnetic RAM (MRAM) cells.

In an example embodiment, the memory cell array 100 may include a three-dimensional (3D) memory cell array, which may include a plurality of NAND strings. Each of the NAND strings may include memory cells respectively connected to word lines vertically stacked on a substrate. This will be described with reference to FIGS. 2 to 3B. Structures of a 3D memory array, in which the 3D memory array includes a plurality of levels and word lines and/or bit lines are shared by levels, are disclosed in U.S. Pat. Nos. 7,679,133, 8,553,466, 8,654,587, 8,559,235, and U.S. Patent Application No. 2011/0233648, the disclosures of which are incorporated herein in their entirety by reference. However, embodiments are not limited thereto. In some embodiments, the memory cell array 100 may include a two-dimensional (2D) memory cell array, which may include a plurality of NAND strings in row and column directions.

The page buffer 210 may be connected to the memory cells of the memory cell array 100 through the bit lines BL. The page buffer 210 may operate according to a page buffer control signal PCTL provided by the control logic circuit 230. The page buffer 210 may operate as a write driver and apply a voltage, which corresponds to data to be stored in the memory cell array 100, to a bit line BL in a program operation and operate as a sense amplifier and sense data, which has been stored in the memory cell array 100, in a read operation.

The control logic circuit 230 may output various control signals, e.g., a row address R_ADDR, a column address C_ADDR, a control signal CTRL_BIAS, and the page buffer control signal PCTL, based on a command CMD, an address ADDR, and a control signal CTRL, which are received from outside, to program data to the memory cell array 100, read data from the memory cell array 100, or erase data from the memory cell array 100. The control logic circuit 230 may hereby generally control various operations of the memory device 10. For example, the control logic circuit 230 may receive the command CMD, the address ADDR, and the control signal CTRL from a memory controller.

In response to the row address R_ADDR from the control logic circuit 230, the row decoder 220 may select one of the memory blocks BLK1 to BLKp, one of the word lines WL of the selected memory block, and one of the string selection lines SSL. For example, the row decoder 220 may apply a program voltage and a program verify voltage to a selected word line in a program operation and apply a read voltage to a selected word line in a read operation.

The data I/O circuit 240 may exchange data with an external device and may be connected to the page buffer 210 through a plurality of data lines DLs. In addition, the data I/O circuit 240 may operate in response to the column address C_ADDR from the control logic circuit 230. The peripheral circuit 200 may further include an electrostatic discharge (ESD) circuit and a pull-up/pull-down driver.

The common source line driver 250 may be connected to the memory cell array 100 through a common source line CSL. The common source line driver 250 may apply a voltage to the common source line CSL based on the control signal CTRL_BIAS from the control logic circuit 230. For example, the common source line driver 250 may apply a power supply voltage or a ground voltage to the common source line CSL.

Figure 2:
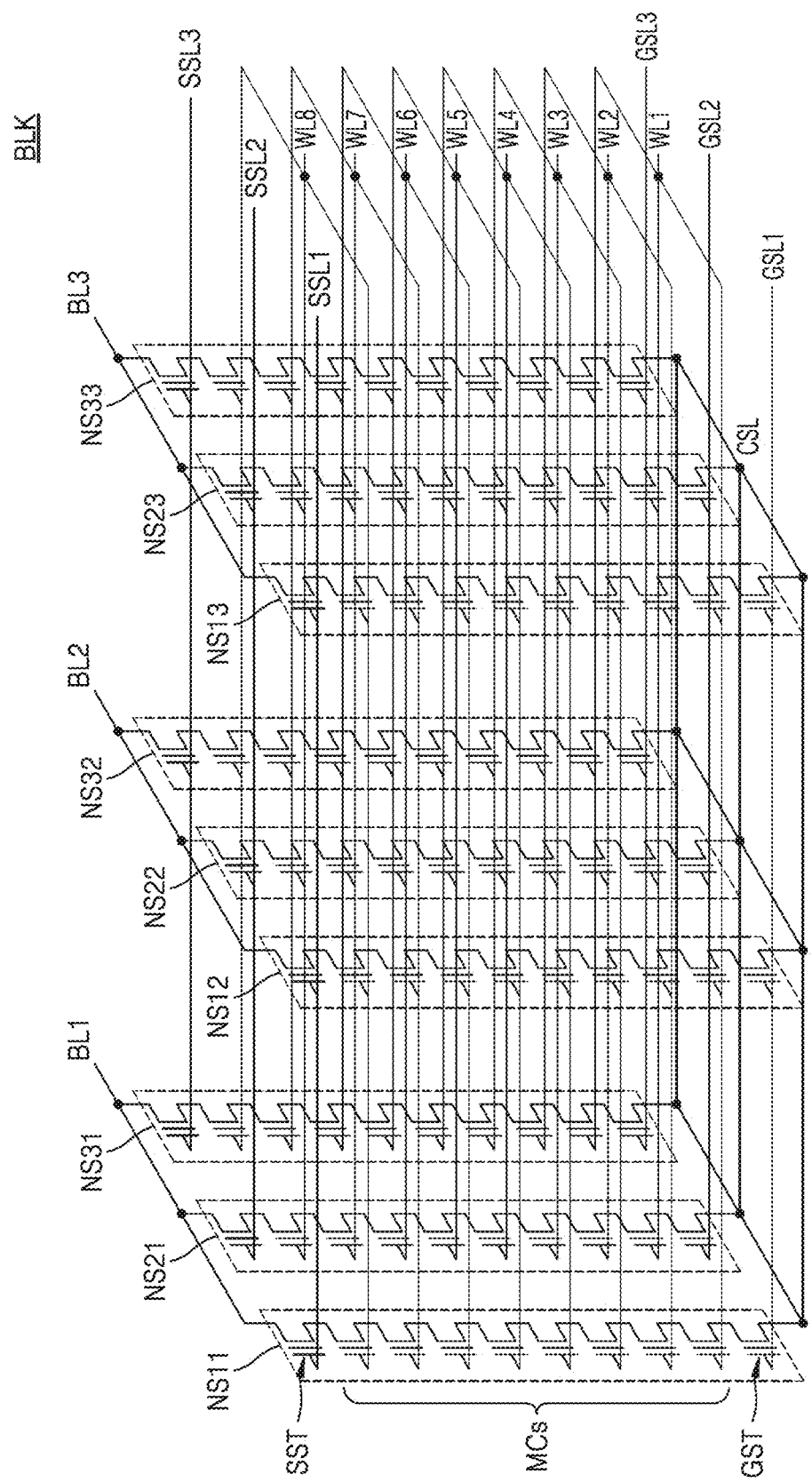
FIG. 2 is a circuit diagram of a memory block according to an example embodiment.

FIG. 2 is a circuit diagram of a memory block BLK according to an example embodiment.

Referring to FIG. 2, the memory block BLK may correspond to one of the memory blocks BLK1 through BLKp in FIG. 1. The memory block BLK may include NAND strings NS11 through NS33, of which each (e.g., NS11) may include a string selection transistor SST, a plurality of memory cells MCs, and a ground selection transistor GST, which are connected in series to one another. The transistors (e.g., the string selection transistor SST and the ground selection transistor GST) and the memory cells MCs included in each NAND string may form a stack structure on a substrate in a vertical direction.

First to third bit lines BL1 to BL3 may extend in first direction or a first horizontal direction, and word lines WL1 to WL8 may extend in a second direction or a second horizontal direction. Here, the first horizontal direction refers to the first direction, and the second horizontal direction refers to the second direction. The first horizontal direction and the second horizontal direction being perpendicular to each other and perpendicular to the vertical direction. The NAND strings NS11, NS21, and NS31 may be between the first bit line BL1 and the common source line CSL; the NAND strings NS12, NS22, and NS32 may be between the second bit line BL2 and the common source line CSL; and the NAND strings NS13, NS23, and NS33 may be between the third bit line BL3 and the common source line CSL.

The string selection transistor SST may be connected to a corresponding one of string selection lines SSL1 to SSL3. Each of the memory cells MCs may be connected to a corresponding one of the word lines WL1 to WL8. The ground selection transistor GST may be connected to a corresponding one of ground selection lines GSL1 to GSL3. The string selection transistor SST may be connected to a corresponding one of the first to third bit lines BL1 to BL3, and the ground selection transistor GST may be connected to the common source line CSL. Here, the numbers of NAND strings, word lines, bit lines, ground selection lines, and string selection lines may vary with embodiments.

Figure 3A:
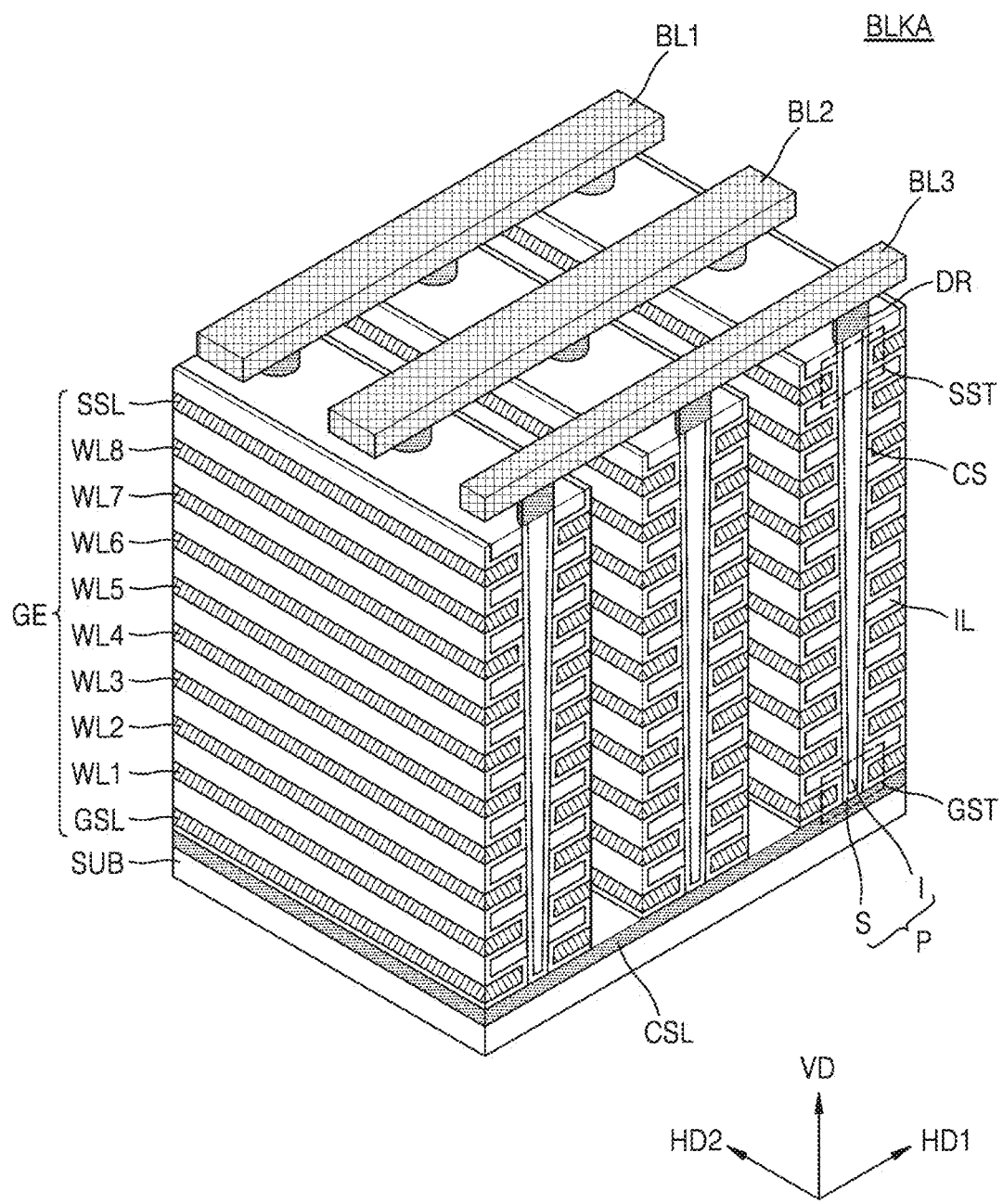
FIG. 3A is a perspective view of a memory block according to an example embodiment.

FIG. 3A is a perspective view of a memory block BLKA according to an example embodiment.

Referring to FIG. 3A, the memory block BLKA may correspond to one of the memory blocks BLK1 to BLKp in FIG. 1. The memory block BLKA is formed in a vertical direction VD with respect to a substrate SUB. The substrate SUB has a first conductivity type (e.g., a p-type) and extends on the substrate SUB in a second horizontal direction HD2. In an example embodiment, the substrate SUB may include polysilicon, and a plate common source line CSL may be on the substrate SUB. For example, the plate common source line CSL may correspond to a region doped with impurities of a second conductivity type (e.g., an n-type). A plurality of insulating films IL extending in the second horizontal direction HD2 are sequentially provided in the vertical direction VD on the substrate SUB. The insulating films IL are separated from each other by a certain distance in the vertical direction VD. For example, the insulating films IL may include an insulating material such as silicon oxide.

A plurality of pillars P are arranged on the substrate SUB in a first horizontal direction HD1. The pillars P pass through the insulating films IL in the vertical direction VD. For example, the pillars P pass through the insulating films IL to be in contact with the substrate SUB. In detail, a surface layer S of each pillar P may include a silicon material of the first conductivity type and may function as a channel region. Accordingly, in some embodiments, the pillar P may be referred to as a channel structure or a vertical channel structure. An inner layer I of each pillar P may include an insulating material such as silicon oxide or an air gap.

A charge storage layer CS is provided along the exposed surfaces of the insulating films IL, the pillars P, and the substrate SUB. The charge storage layer CS may include a tunneling insulating layer (or referred to as a "tunneling dielectric film"), a charge trap layer, and a blocking insulating layer (or referred to as "blocking dielectric film"). For example, the charge storage layer CS may have an oxide-nitride-oxide (ONO) structure. Gate electrodes GE, such as selection lines, e.g., a ground selection line GSL and a string selection line SSL, and the word lines WL1 to WL8, are provided on an exposed surface of the charge storage layer CS.

Drain contacts or drains DR are respectively provided on the pillars P. For example, the drains DR may include a silicon material doped with impurities of the second conductivity type. The first to third bit lines BL1 to BL3 extend on the drains DR in the first horizontal direction HD1 and are separated from each other by a certain distance in the second horizontal direction HD2.

Figure 3B:
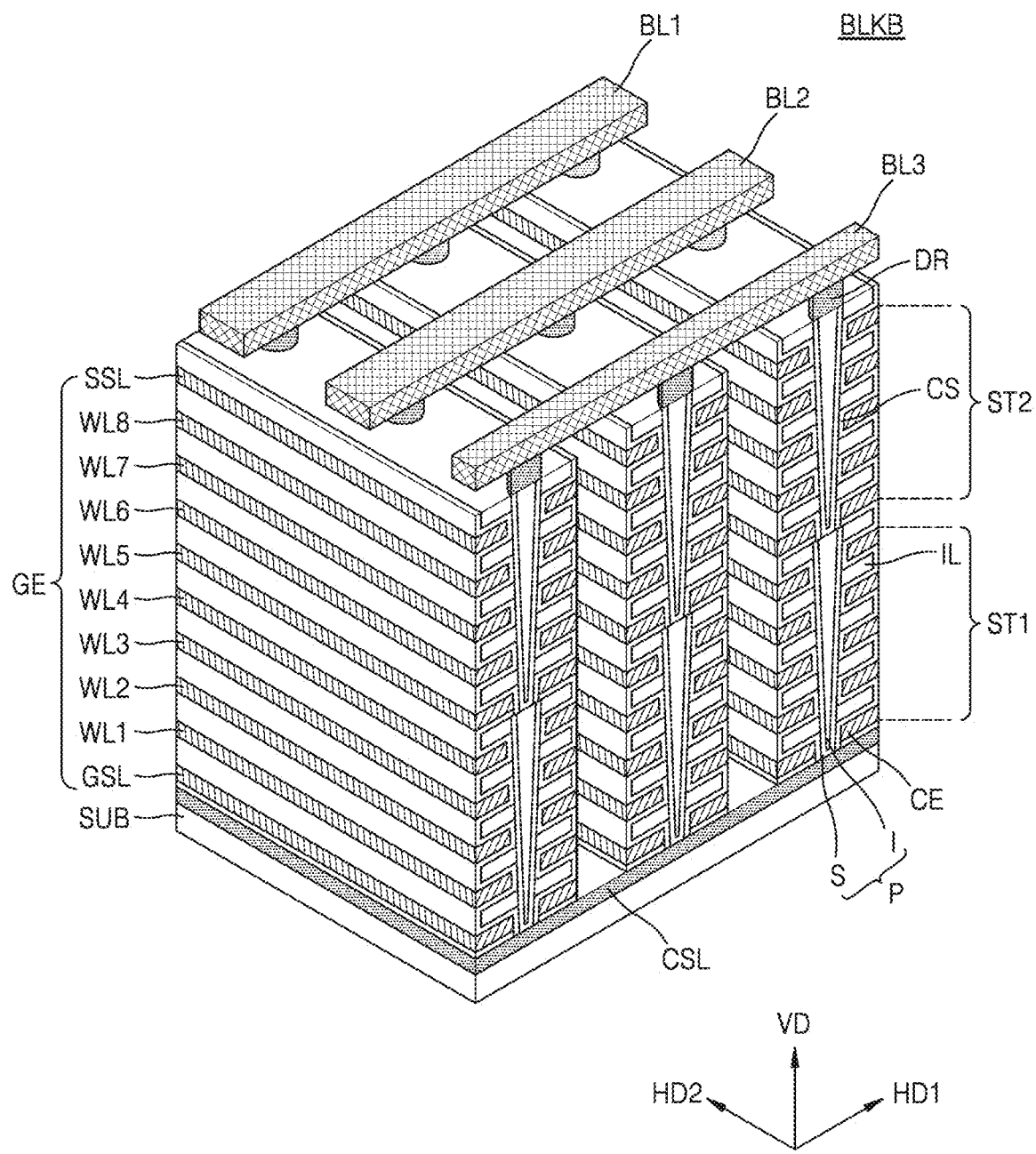
FIG. 3B is a perspective view of a memory block according to an example embodiment.

FIG. 3B is a perspective view of a memory block BLKB according to an example embodiment.

Referring to FIG. 3B, the memory block BLKB may correspond to one of the memory blocks BLK1 to BLKp in FIG. 1. The memory block BLKB corresponds to a modification of the memory block BLKA of FIG. 3A, and the descriptions given with reference to FIG. 3A may also be applied to the present embodiment. The memory block BLKB may be formed in the vertical direction VD with respect to the substrate SUB. The memory block BLKB may include a first memory stack ST1 and a second memory stack ST2, which may be stacked in the vertical direction VD.

Figure 4:
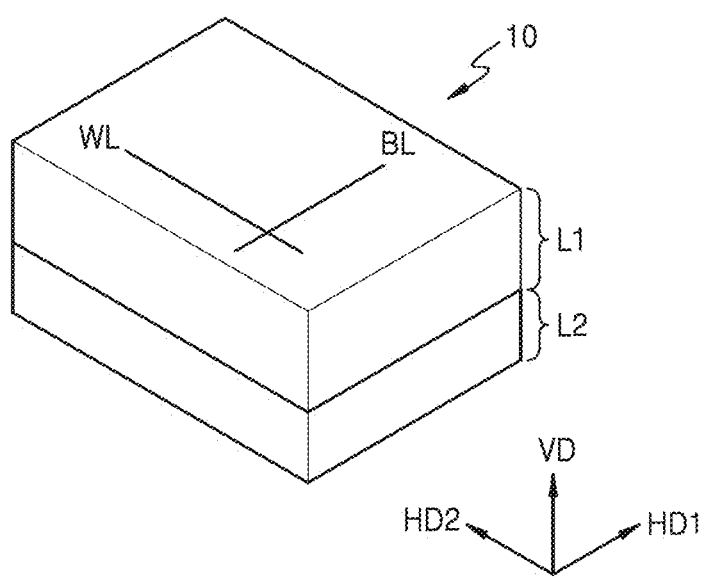
FIG. 4 is a schematic diagram of a memory device having a cell-over-periphery (COP) structure, according to an example embodiment.

FIG. 4 is a schematic diagram of the memory device 10 having a cell-over-periphery (COP) structure, according to an example embodiment.

Referring to FIG. 4, the memory device 10 may include a first semiconductor layer L1 and a second semiconductor layer L2. The first semiconductor layer L1 may be stacked on the second semiconductor layer L2 in the vertical direction VD. In detail, the second semiconductor layer L2 may be below the first semiconductor layer L1 in the vertical direction VD.

In an example embodiment, the memory cell array 100 in FIG. 1 may be formed in the first semiconductor layer L1, and the peripheral circuit 200 in FIG. 1 may be formed in the second semiconductor layer L2. Here, the first semiconductor layer L1 may be referred to as a "memory cell array region", and the second semiconductor layer L2 may be referred to as a "peripheral circuit region". Accordingly, the memory device 10 may have a COP structure, in which the memory cell array 100 may be above the peripheral circuit 200. The COP structure may effectively reduce a horizontal area and may increase the integration density of the memory device 10.

Figure 11:
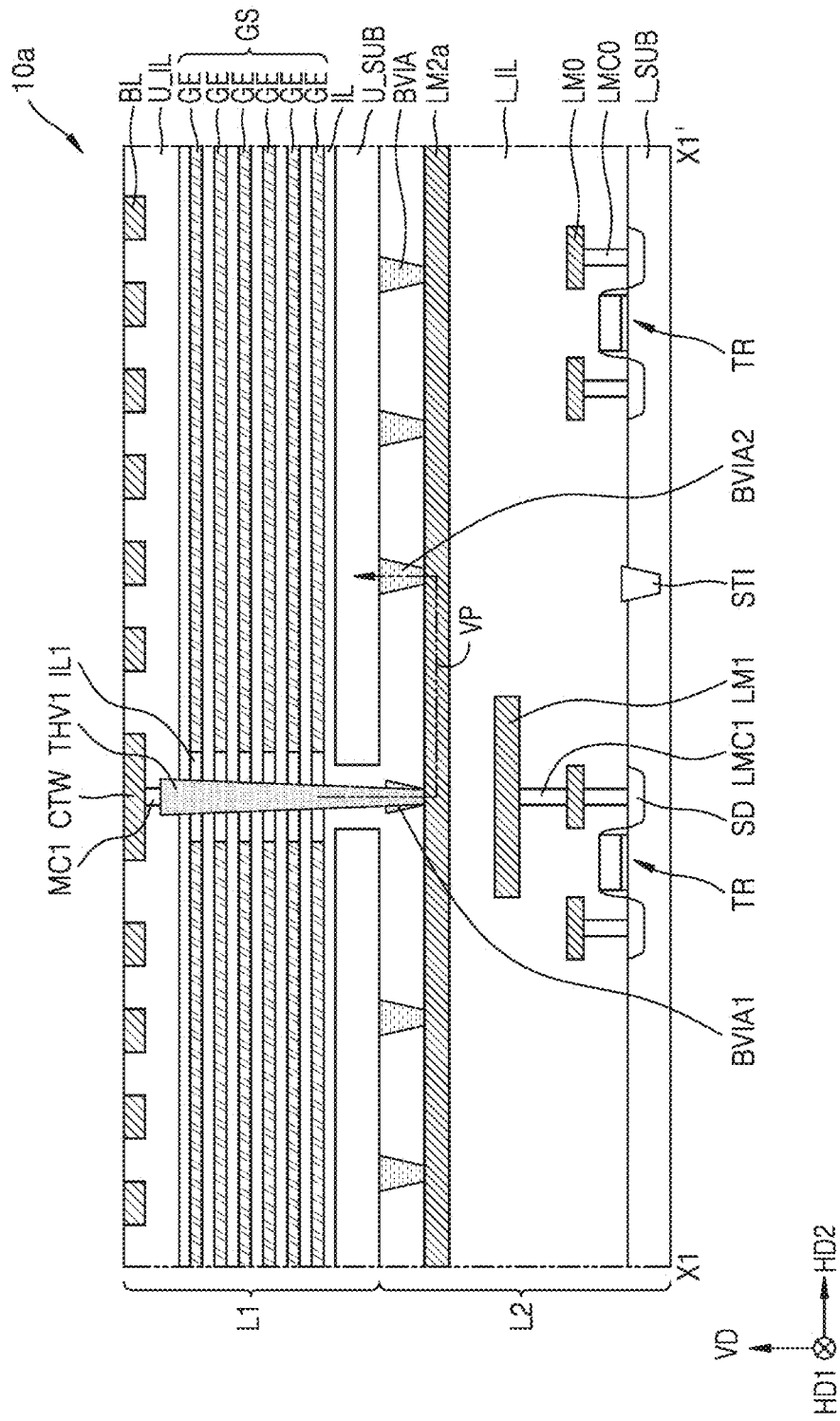
FIG. 11 is a cross-sectional view taken along line X1-X1' in FIG. 10, according to an example embodiment.

In an example embodiment, the second semiconductor layer L2 may include a lower substrate (e.g., L_SUB in FIG. 11). The peripheral circuit 200 may be formed in the second semiconductor layer L2 by forming transistors and metal patterns, which interconnect the transistors, on the lower substrate. After the peripheral circuit 200 is formed in the second semiconductor layer L2, the first semiconductor layer L1 including the memory cell array 100 may be formed. Metal patterns, which electrically connect word lines WL and bit lines BL of the memory cell array 100 to the peripheral circuit 200 in the second semiconductor layer L2, may be formed. For example, the word lines WL may extend in the first horizontal direction HD1, and the bit lines BL may extend in the second horizontal direction HD2. For example, the memory block BLKA of FIG. 3A or the memory block BLKB of FIG. 3B may be formed in the first semiconductor layer L1.

Figure 5:
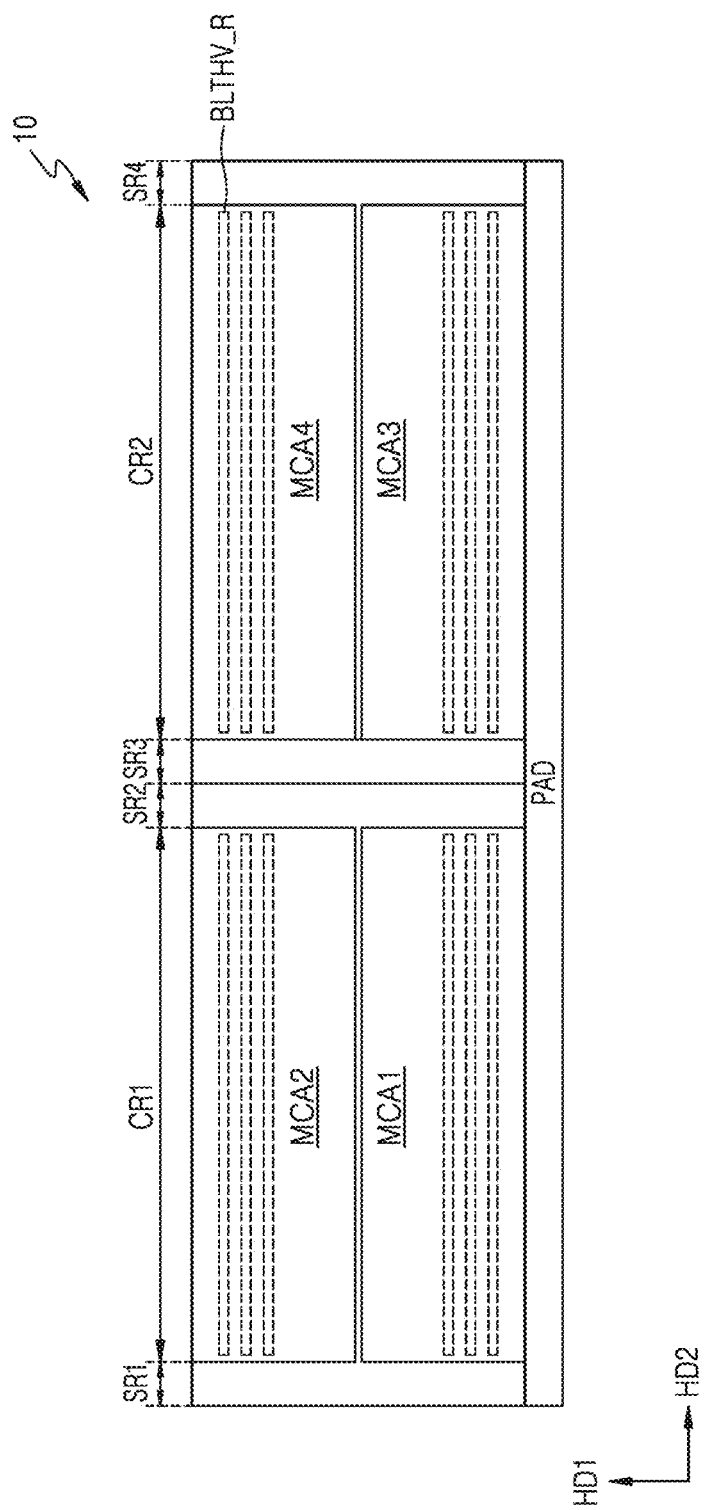
FIG. 5 is a plan view of a memory device according to an example embodiment.

FIG. 5 is a plan view of the memory device 10 according to an example embodiment.

Referring to FIG. 5, the memory device 10 may be divided in the second horizontal direction HD2 into a first cell region CR1, a second cell region CR2, and first to fourth word line stair regions SRL SR2, SR3, and SR4. However, embodiments are not limited thereto. The number of cell regions of the memory device 10 may vary with embodiments. In some embodiments, the second and third word line stair regions SR2 and SR3 may be separated from each other in the second horizontal direction HD2. The memory device 10 may further include a pad region PAD, in which a plurality of I/O pads are arranged.

First and second memory cell arrays MCA1 and MCA2 adjacent to each other in the first horizontal direction HD1 may be arranged in the first cell region CR1, and third and fourth memory cell arrays MCA3 and MCA4 adjacent to each other in the first horizontal direction HD1 may be arranged in the second cell region CR2. Here, each of the first to fourth memory cell arrays MCA1 to MCA4 may be referred to as a "memory array tile (MAT)". However, embodiments are not limited thereto. The number of memory cell arrays in each of the first and second cell regions CR1 and CR2 may vary with embodiments.

Each of the first to fourth memory cell arrays MCA1 to MCA4 may include a plurality of bit line through-hole via regions BLTHV_R, which extend in the second horizontal direction HD2 and are separated from each other in the first horizontal direction HD1. For example, each of the first to fourth memory cell arrays MCA1 to MCA4 may include three bit line through-hole via regions BLTHV_R, but embodiments are not limited thereto. The arrangement of the bit line through-hole via regions BLTHV_R in each of the first to fourth memory cell arrays MCA1 to MCA4 may vary with embodiments.

Figure 6:
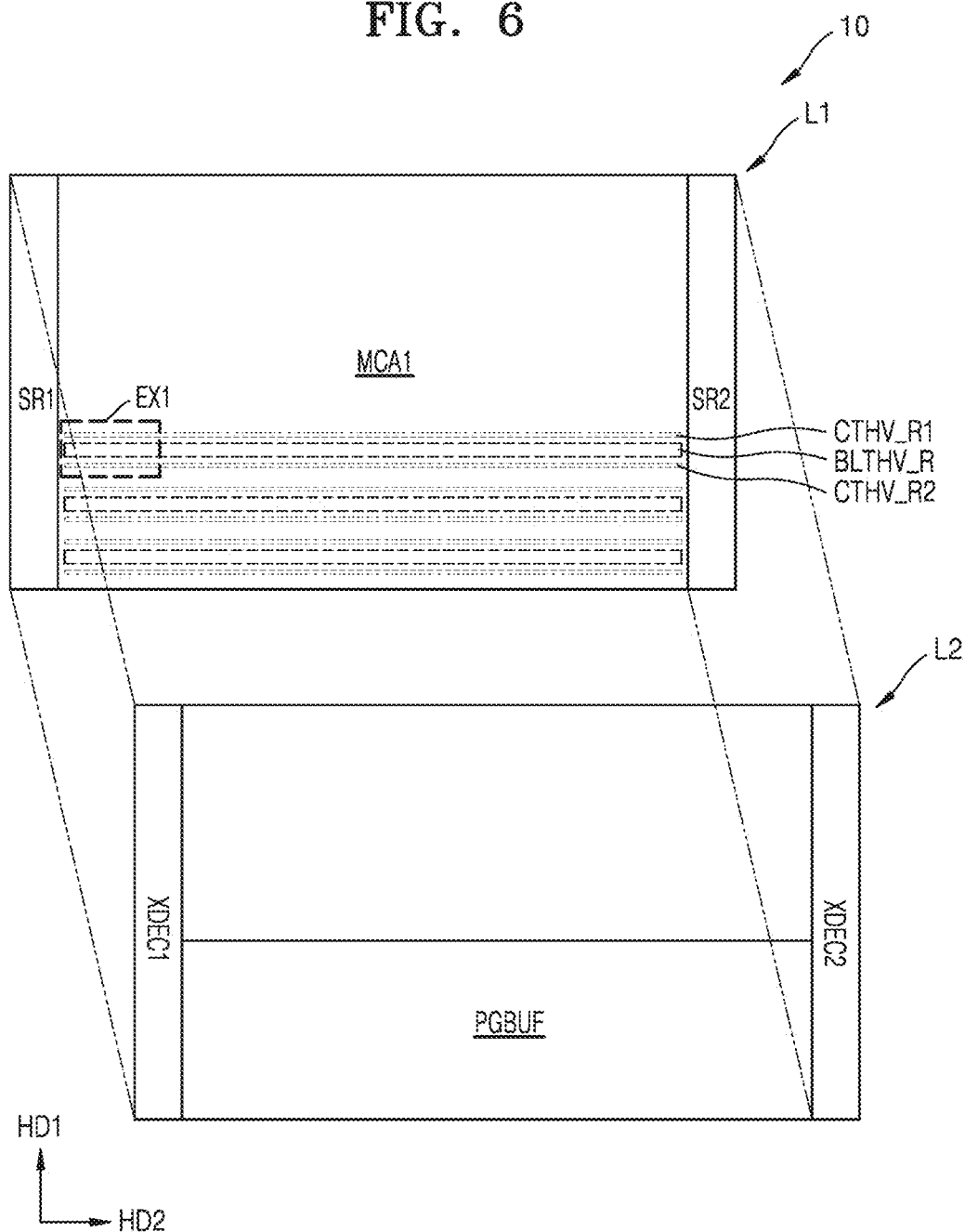
FIG. 6 illustrates a first semiconductor layer and a second semiconductor layer of a memory device, according to an example embodiment.

FIG. 6 illustrates the first semiconductor layer L1 and the second semiconductor layer L2 of the memory device 10, according to an example embodiment. The first and second semiconductor layers L1 and L2 may correspond to a portion of the memory device 10 of FIG. 5

Referring to FIG. 6, the first semiconductor layer L1 may include the first memory cell array MCA1 and the first and second word line stair regions SR1 and SR2, and the first and semiconductor layers L1 and L2 in FIG. 6 may respectively correspond to the first and semiconductor layers L1 and L2 in FIG. 4. The first semiconductor layer L1 may include the bit line through-hole via regions BLTHV_R, in which a plurality of bit line through-hole vias (bit line through-hole via structures) respectively connected to a plurality of bit lines are arranged. The first semiconductor layer L1 may further include a first region CTHV_R1 and a second region CTHV_R2 respectively at both sides of each of the bit line through-hole via regions BLTHV_R in the first horizontal direction HD1. Here, the first and second regions CTHV_R1 and CTHV_R2 may correspond to "common source line through-hole via regions" in which common source line through-hole vias connected to a common source line tapping wire may be arranged.

The second semiconductor layer L2 may include first and second row decoder regions XDEC1 and XDEC2, which respectively correspond to the first and second word line stair regions SR1 and SR2. For example, the row decoder 220 in FIG. 1 may be arranged in the first and second row decoder regions XDEC1 and XDEC2. The second semiconductor layer L2 may further include a page buffer region PGBUF, which corresponds to the bit line through-hole via regions BLTHV_R and the first and second regions CTHV_R1 and CTHV_R2. For example, the page buffer 210 in FIG. 1 may be arranged in the page buffer region PGBUF. The control logic circuit 230 in FIG. 1 may be arranged in an area, which is adjacent to the page buffer region PGBUF in the first horizontal direction HD1 in the first semiconductor layer L1.

Figure 7:
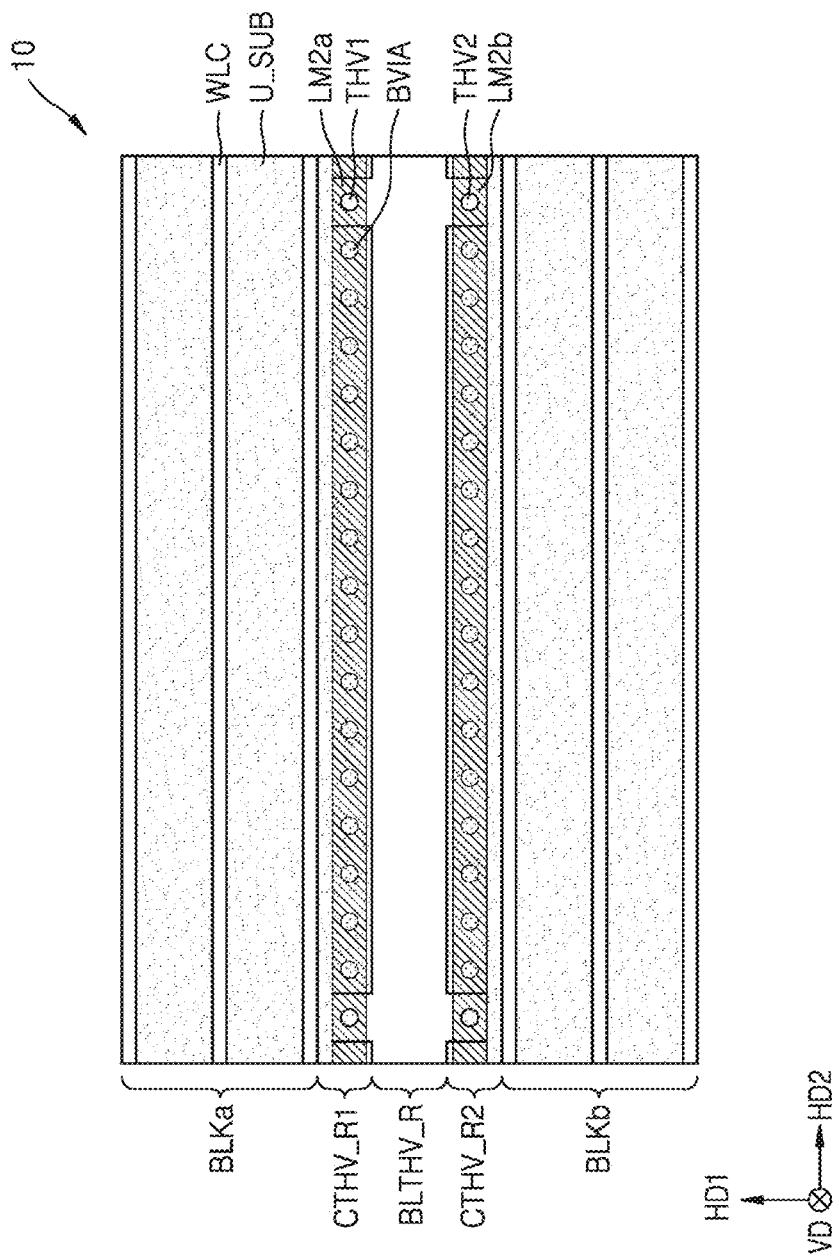
FIG. 7 is an enlarged plan view of some elements in region EX1 in FIG. 6, according to an example embodiment.
Figure 8:
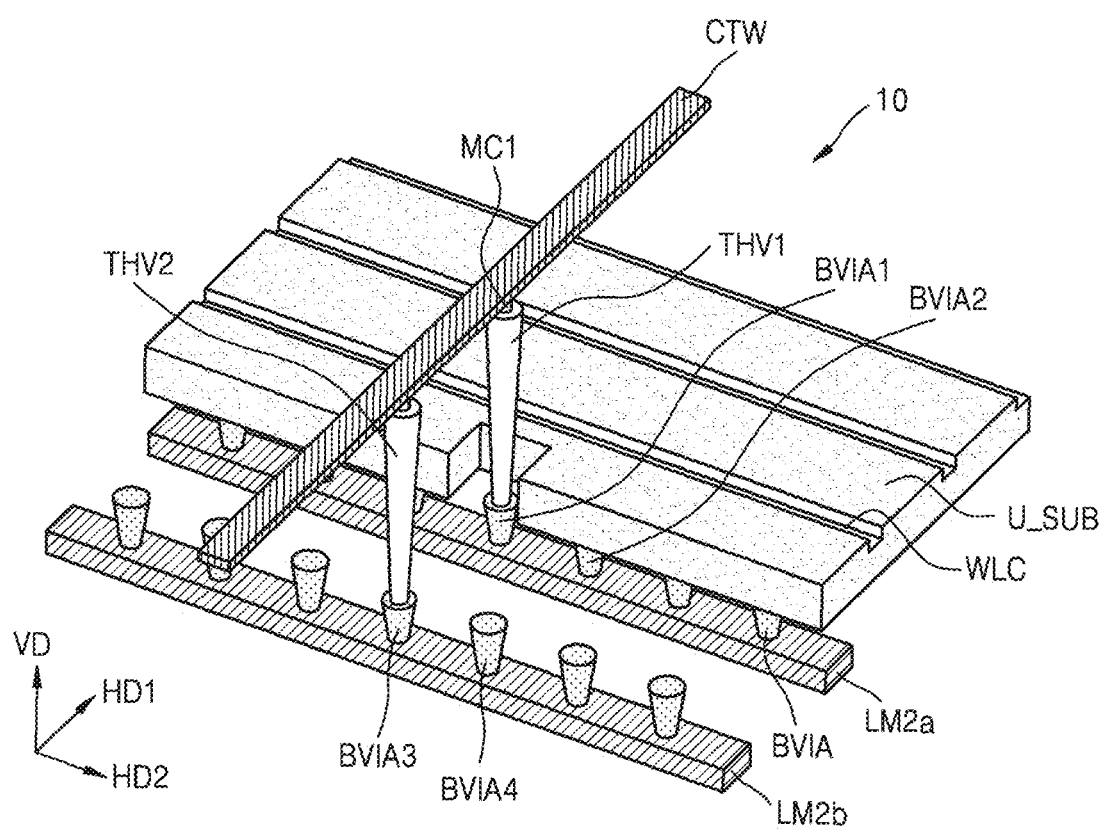
FIG. 8 is an enlarged perspective view of some elements in the region EX1 in FIG. 6, according to an example embodiment.

FIG. 7 is an enlarged plan view of some elements in region EX1 in FIG. 6, according to an example embodiment. FIG. 8 is an enlarged perspective view of some elements in the region EX1 in FIG. 6, according to an example embodiment.

Referring to FIGS. 6 to 8, the memory device 10 may include memory blocks BLKa and BLKb, which may extend in the second horizontal direction HD2, on an upper substrate U_SUB. The memory device 10 may also include a plurality of word line cut regions or word line cut structures WLC, which may extend in the second horizontal direction HD2 and are separated from each other in the first horizontal direction HD1. For example, each of the memory blocks BLKa and BLKb may be arranged in a region that may be defined by three adjacent word line cut structures WLC. However, example embodiments are not limited thereto. In some embodiments, each of the memory blocks BLKa and BLKb may be arranged in a region that may be defined by two adjacent word line cut structures WLC.

The memory device 10 may further include a bit line through-hole via region BLTHV_R extending in the second horizontal direction HD2. The upper substrate U_SUB may be removed from the bit line through-hole via region BLTHV_R such that bit line through-hole vias extend to the second semiconductor layer L2. For example, an insulating film may be arranged in the bit line through-hole via region BLTHV_R. The memory device 10 may further include the first and second regions CTHV_R1 and CTHV_R2, which may be arranged at both sides of the bit line through-hole via region BLTHV_R in the first horizontal direction HD1 and extend in the second horizontal direction HD2. Here, the first region CTHV_R1 may be between the memory block BLKa and the bit line through-hole via region BLTHV_R, and the second region CTHV_R2 may be between the bit line through-hole via region BLTHV_R and the memory block BLKb.

The memory device 10 may further include first and second lower metal lines LM2*a* and LM2*b* and a plurality of vias (via structures) BVIA. The first and second lower metal lines LM2*a* and LM2*b* and the vias BVIA may be arranged in the second semiconductor layer L2. The first and second lower metal lines LM2*a* and LM2*b* may be respectively below the first and second regions CTHV_R1 and CTHV_R2 in the vertical direction VD and may extend in the second horizontal direction HD2. The vias BVIA may be separated from each other in the second horizontal direction HD2 in the first and second lower metal lines LM2*a* and LM2*b*. The top surfaces of the vias BVIA may be in contact with the upper substrate U_SUB. In other words, the top surfaces of the vias BVIA may be at the same level in the vertical direction as the bottom surface of the upper substrate U_SUB. However, the top surfaces of first and third vias BVIA1 and BVIA3 respectively connected to first and second through-hole vias THV1 and THV2 may be at a lower level in the vertical direction than the bottom surface of the upper substrate U_SUB. According to an example embodiment, the vias BVIA may be referred to as "bypass vias". According to embodiments, the number of vias BVIA in each of the first and second lower metal lines LM2a and LM2b may vary, and a distance between adjacent vias BVIA may also vary.

The memory device 10 may further include a common source line tapping wire CTW, the first and second through-hole vias THV1 and THV2, and metal contacts MC1. The common source line tapping wire CTW, the first and second through-hole vias THV1 and THV2, and the metal contacts MC1 may be arranged in the first semiconductor layer L1. The common source line tapping wire CTW may extend in the first horizontal direction HD1 and may be connected to the first and second through-hole vias THV1 and THV2 through the metal contacts MC1.

The first through-hole via THV1 may be in the first region CTHV_R1 and may extend in the vertical direction VD to pass through the upper substrate U_SUB and the first via BVIA1 and to be connected to the first lower metal line LM2a. According to the present embodiment, the common source line tapping wire CTW may be electrically connected to the upper substrate U_SUB through a metal contact MC1, the first through-hole via THV1, the first lower metal line LM2a, and a plurality of vias BVIA including the first via BVIA1 and a second BVIA2. Accordingly, a voltage applied to the common source line tapping wire CTW may be provided to the upper substrate U_SUB, that is, a plate common source line of the upper substrate U_SUB.

The second through-hole via THV2 may be in the second region CTHV_R2 and may extend in the vertical direction VD to pass through the upper substrate U_SUB and the third via BVIA3 and to be connected to the second lower metal line LM2b. A portion of the upper substrate U_SUB is not illustrated in FIG. 8 to clearly show the structure of the third via BVIA3 and a fourth via BVIA4. Although not shown, the common source line tapping wire CTW may be electrically connected to the upper substrate U_SUB through a metal contact MC1, the second through-hole via THV2, the second lower metal line LM2b, and a plurality of vias BVIA including the third and fourth vias BVIA3 and BVIA4. Accordingly, a voltage applied to the common source line tapping wire CTW may be provided to the upper substrate U_SUB, that is, the plate common source line of the upper substrate U_SUB. The first through-hole via THV1 and the second through-hole via THV2 may include conductive or semiconductive material such that the electrical connections may be made using the first through-hole via THV1 and the second through-hole via THV2.

Figure 9:
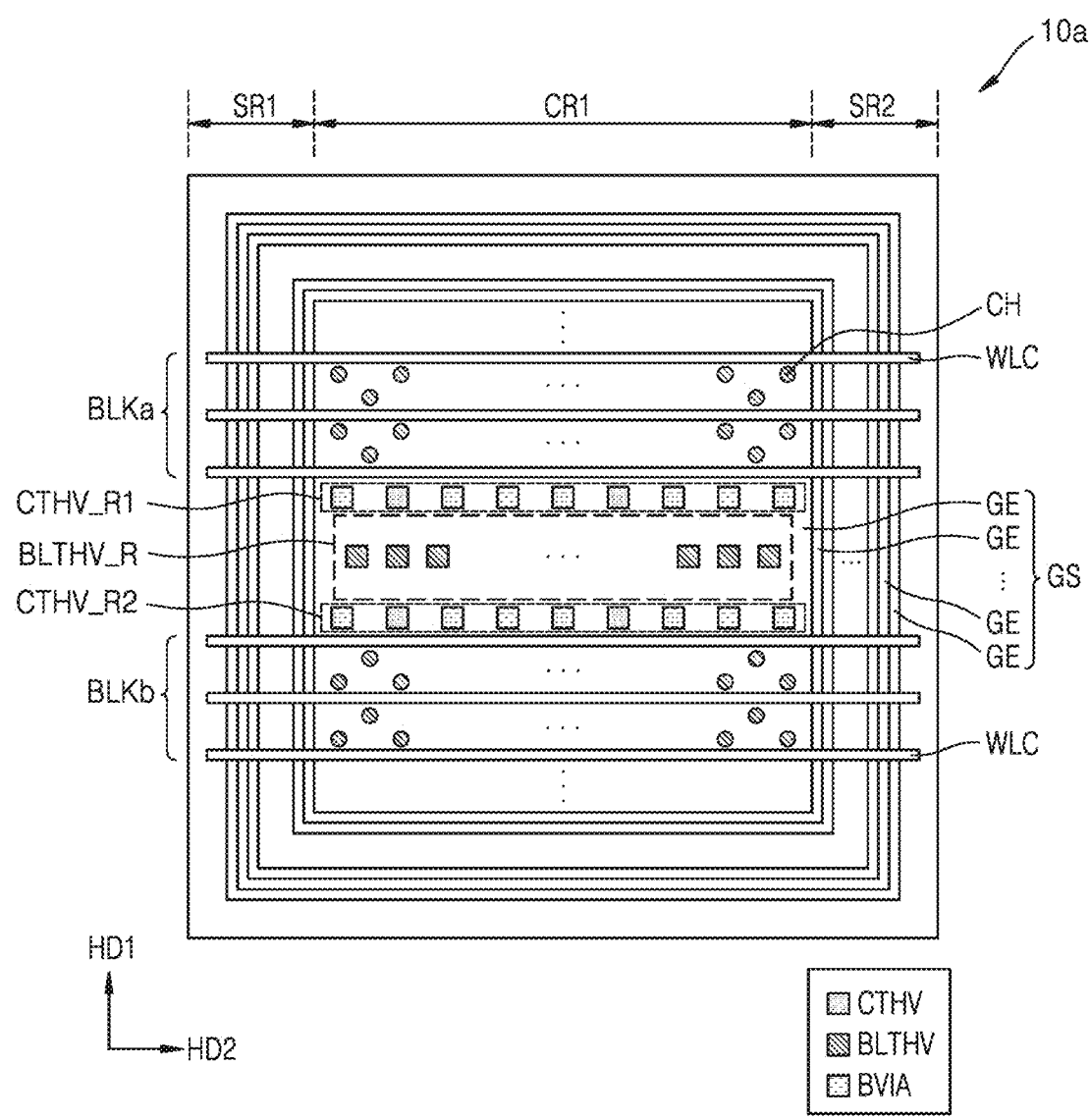
FIG. 9 is a schematic plan view of a portion of a memory device according to an example embodiment.

FIG. 9 is a schematic plan view of a portion of a memory device 10a according to an example embodiment. The memory device 10a may correspond to an implementation of the memory device 10 of FIG. 6. The descriptions given with reference to FIGS. 6 to 8 may also be applied to the present embodiment.

Referring to FIG. 9, the memory device 10a may include the upper substrate U_SUB and a gate stack GS, which includes gate electrodes GE on the upper substrate U_SUB. The gate electrodes GE may be stacked on the upper substrate U_SUB in the vertical direction VD and electri-cally insulated from each other by the insulating films IL (in FIG. 11). The gate electrodes GE may extend in the second horizontal direction HD2, and ends of the gate electrodes GE may form a stair shape in each of the first and second word line stair regions SR1 and SR2. The area of each of the gate electrodes GE may decrease away from the upper substrate U_SUB. A central portion of each of the gate electrodes GE, which may overlap with each other in the vertical direction VD, may form the first cell region CR1. Edge portions of each of the gate electrodes GE may respectively form the first and second word line stair regions SR1 and SR2. For example, the gate electrodes GE may include the ground selection line GSL, the word lines WL1 to WL8, and the string selection line SSL.

A plurality of word line cut structures WLC may be on the upper substrate U_SUB and extend in the second horizontal direction HD2 across the first cell region CR1 and the first and second word line stair regions SR1 and SR2. The word line cut structures WLC may be separated from each other in the first horizontal direction HD1. Although not shown, at least one string selection line cut structure may be between two adjacent word line cut structures WLC. In an example embodiment, two string selection line cut structures may be between two adjacent word line cut structures WLC, and accordingly, three string selection lines may be between the two adjacent word line cut structures WLC. For example, the first memory block BLKa may be in a region defined by three adjacent word line cut structures WLC and include six string selection lines.

Each of the memory blocks BLKa and BLKb may include a plurality of channel structures CH. The channel structures CH may extend in the vertical direction VD and pass through the gate electrodes GE and the insulating films IL. A plurality of bit line through-hole vias BLTHV may be arranged in a bit line through-hole via region BLTHV_R. Although it is illustrated for convenience in FIG. 9 that the bit line through-hole vias BLTHV are arranged in line, embodiments are not limited thereto. The number and arrangement of bit line through-hole vias BLTHV may vary with embodiments. For example, the bit line through-hole vias BLTHV may be arranged in zigzag. A plurality of vias BVIA and through-hole vias CTHV may be arranged below the first and second regions CTHV_R1 and CTHV_R2. This will be described with reference to FIGS. 10 to 13.

Figure 10:
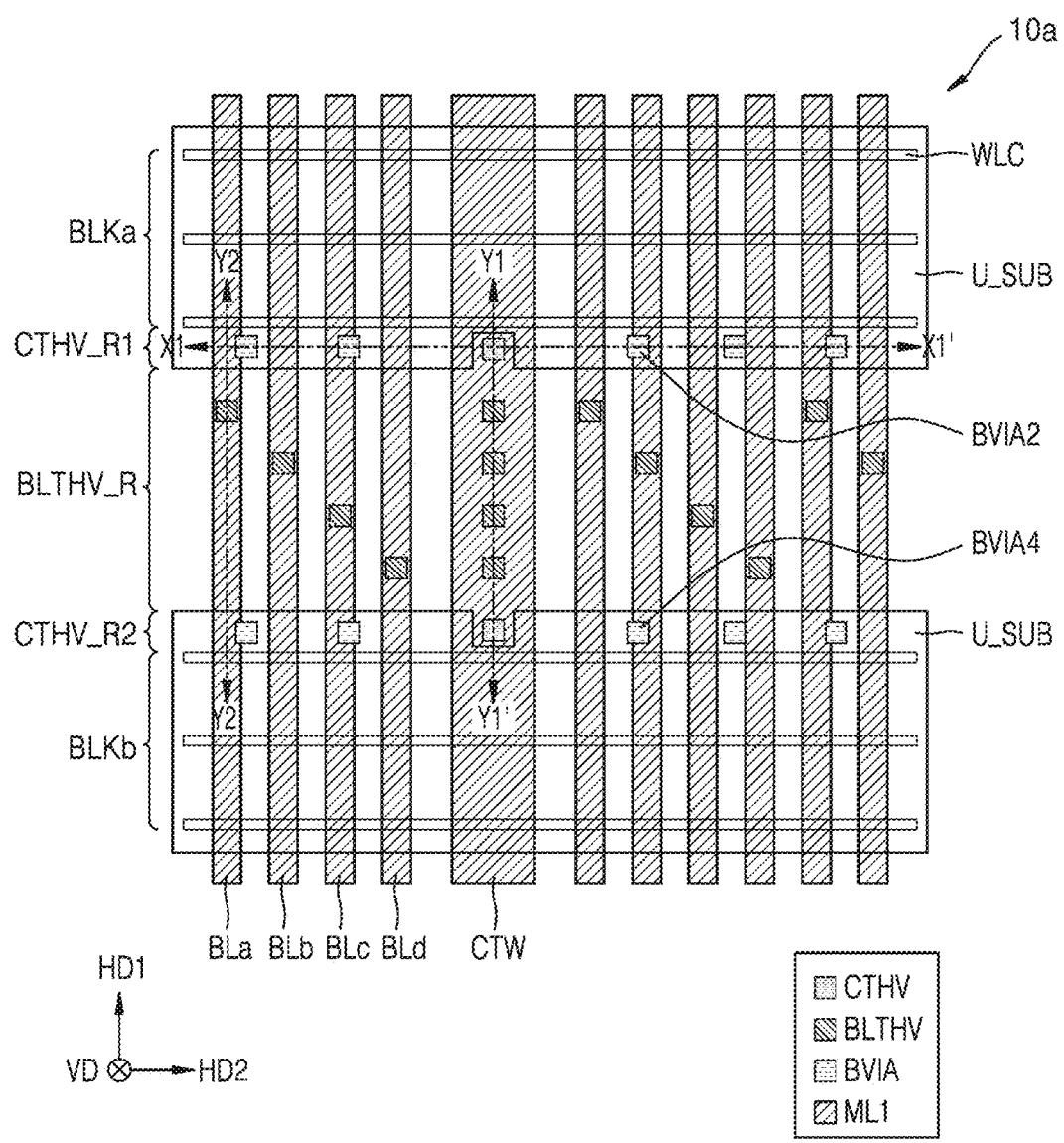
FIG. 10 is a plan view of a portion of the memory device of FIG. 9, according to an example embodiment.
Figure 12:
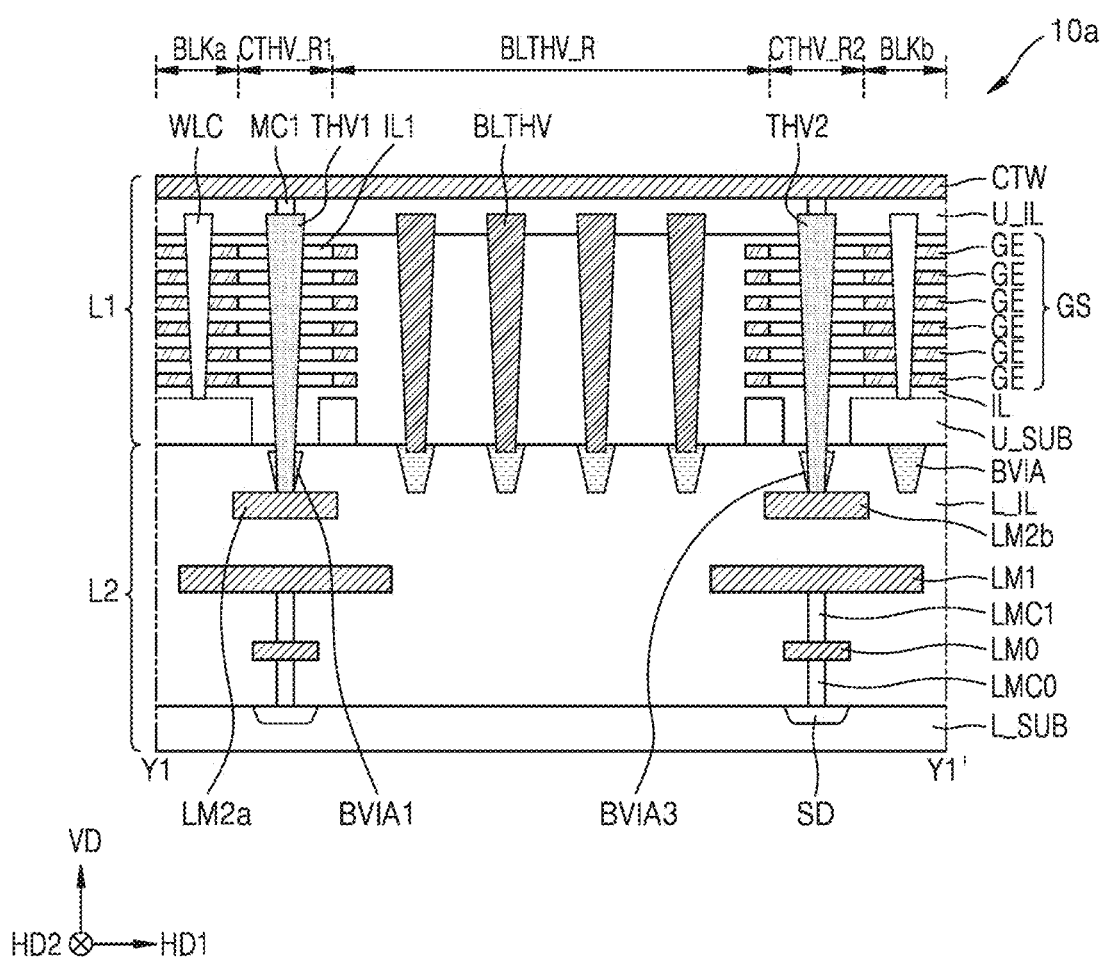
FIG. 12 is a cross-sectional view taken along line Y1-Y1' in FIG. 10, according to an example embodiment.
Figure 13:
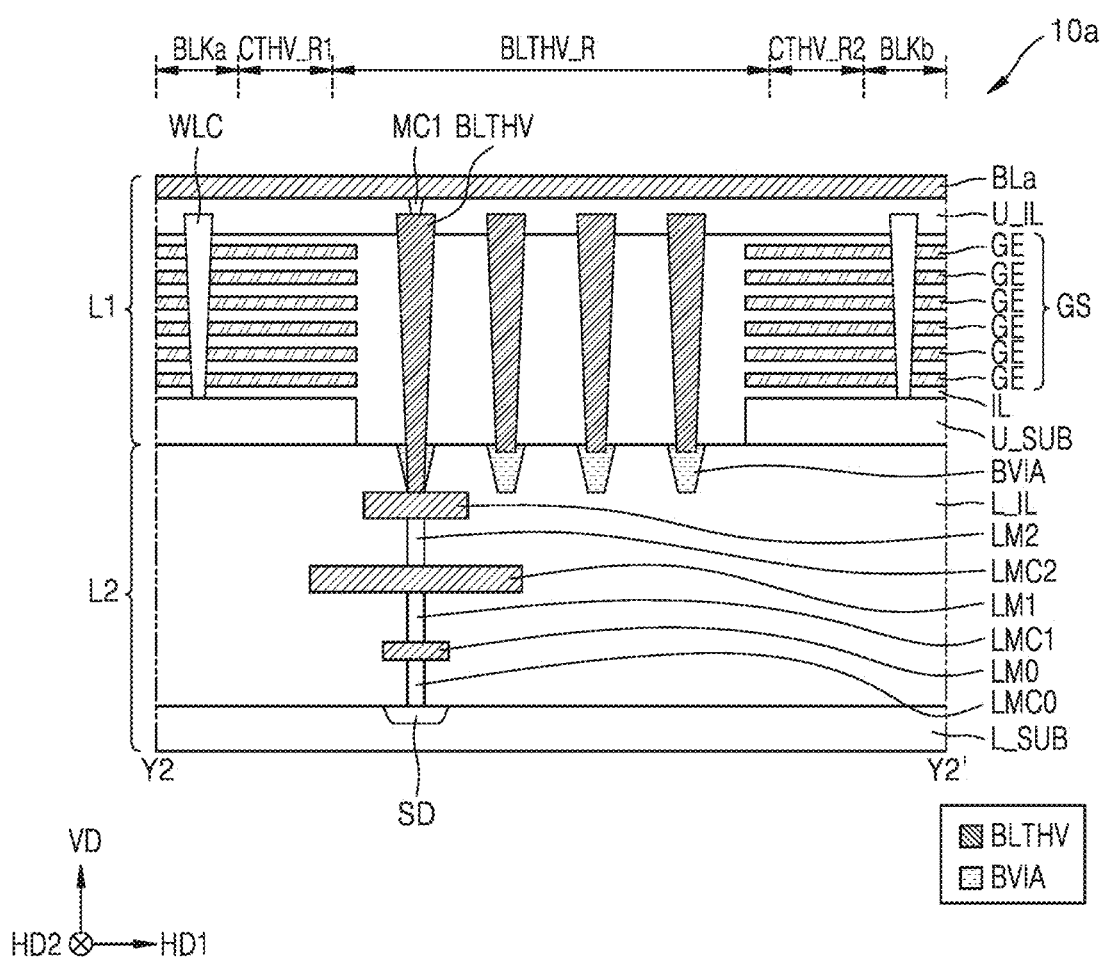
FIG. 13 is a cross-sectional view taken along line Y2-Y2' in FIG. 10, according to an example embodiment.

FIG. 10 is a plan view of a portion of the memory device 10a of FIG. 9, according to an example embodiment. FIG. 11 is a cross-sectional view taken along line X1-X1' in FIG. 10, according to an example embodiment. FIG. 12 is a cross-sectional view taken along line Y1-Y1' in FIG. 10, according to an example embodiment. FIG. 13 is a cross-sectional view taken along line Y2-Y2' in FIG. 10, according to an example embodiment.

Referring to FIGS. 10 to 13, the memory device 10a may include the first and second semiconductor layers L1 and L2 overlapping with each other in the vertical direction VD. The first semiconductor layer L1 may include the upper substrate U_SUB, the gate electrodes GE, the insulating films IL, the first and second through-hole vias THV1 and THV2, bit lines BL including bit lines BLa to BLd, the common source line tapping wire CTW, and an upper insulating layer U_IL. In the present embodiment, the bit lines BL and the common source line tapping wire CTW may be at the same level in the vertical direction and constitute, for example, a first metal layer (first upper metal layer or first upper metal line) ML1. Although not shown, a plurality of metal layers may be on the first metal layer ML1, and metal layers at different levels in the vertical direction may be connected to each other through a metal contact.

The second semiconductor layer L2 may include the lower substrate L_SUB, circuit elements TR, lower metal layers LM0, LM1, and LM2, lower metal contacts LMC0, LMC1, and LMC2, a plurality of vias BVIA, and a lower insulating layer L_IL. For example, the circuit elements TR may correspond to transistors of the peripheral circuit 200 in FIG. 1. A shallow trench isolation STI may be located between separate circuit elements TR. For example, the lower metal layers LM0 and LM2 may extend in the first horizontal direction HD1, and the lower metal layer LM1 may extend in the second horizontal direction HD2, but embodiments are not limited thereto.

The vias BVIA may be arranged on the lower metal layer LM2 and separated from each other in the second horizontal direction HD2, and the top surfaces of the vias BVIA may be in contact with the bottom surface of the upper substrate U_SUB. In other words, the vias BVIA may be between the upper substrate U_SUB and the lower metal layer LM2. However, the top surfaces of the first and third vias BVIA1 and BVIA3 may be at a lower level in the vertical direction than the top surfaces of the other vias BVIA because of an etching process performed to form the first and second through-hole vias THV1 and THV2. The vias BVIA may include a conductive material and thus may be referred to as "conductive landing vias" or "bypass vias". For example, the vias BVIA may include a doped semiconductor material or an undoped semiconductor material. For example, the vias BVIA may include doped or undoped polysilicon but are not limited thereto.

The upper substrate U_SUB may include polysilicon and function as the common source line CSL. Accordingly, the upper substrate U_SUB may function as a source region that supplies current to memory cells on the upper substrate U_SUB. According to some embodiments, the common source line CSL may be formed by doping the upper substrate U_SUB with impurities and may have a plate shape. Accordingly, the upper substrate U_SUB may be defined as including a plate common source line.

The first and second through-hole vias THV1 and THV2 may extend in the vertical direction VD and pass through the gate electrodes GE and the insulating films IL. The first and second through-hole vias THV1 and THV2 may extend in the vertical direction VD to pass through the upper substrate U_SUB. The first and second through-hole vias THV1 and THV2 may further extend in the vertical direction VD to respectively pass through the first and third vias BVIA1 and BVIA3. For example, the first and second through-hole vias THV1 and THV2 may have an annular shape. However, example embodiments are not limited thereto. The first and second through-hole vias THV1 and THV2 may have an elliptic pillar shape or a quadrangular pillar shape. The common source line tapping wire CTW may be above the first and second through-hole vias THV1 and THV2 and connected to each of the first and second through-hole vias THV1 and THV2 through a metal contact MC1.

An insulating ring IL1 may be around each of the first and second through-hole vias THV1 and THV2, and accordingly, the first and second through-hole vias THV1 and THV2 may be electrically insulated from the gate electrodes GE. For example, the insulating ring IL1 may include silicon nitride, but embodiments are not limited thereto.

In an example embodiment, the lower metal layer LM2 may include the first and second lower metal lines LM2*a* and LM2*b*, which extend in the second horizontal direction HD2 and are separated from each other in the first horizontal direction HD1. Here, the first lower metal line LM2*a* may be below the first region CTHV_R1 in the vertical direction VD, and the second lower metal line LM2*b* may be below the second region CTHV_R2 in the vertical direction VD.

The first through-hole via THV1 in the first region CTHV_R1 may pass through the first via BVIA1 to be connected to the first lower metal line LM2*a* and may be connected to the upper substrate U_SUB through the vias BVIA including the second via BVIA2 on the first lower metal line LM2*a*. Accordingly, the common source line tapping wire CTW may be electrically connected to the upper substrate U_SUB through the metal contact MC1, the first through-hole via THV1, the first lower metal line LM2*a*, and the vias BVIA including the second via BVIA2. Here, the first through-hole via THV1, the first lower metal line LM2*a*, and the second via BVIA2 may form a voltage path VP, and a voltage applied to the common source line tapping wire CTW may be transmitted to the plate common source line of the upper substrate U_SUB through the voltage path VP. As described above, the plate common source line may be rewired through the first lower metal line LM2*a* and the vias BVIA including the second via BVIA2 on the first lower metal line LM2*a*.

The second through-hole via THV2 in the second region CTHV_R2 may pass through the third via BVIA3 to be connected to the second lower metal line LM2*b* and may be connected to the upper substrate U_SUB through the vias BVIA including the fourth via BVIA4 on the second lower metal line LM2*b*. Accordingly, the common source line tapping wire CTW may be electrically connected to the upper substrate U_SUB through the metal contact MC1, the second through-hole via THV2, the second lower metal line LM2*b*, and the vias BVIA including the fourth via BVIA4. Here, the second through-hole via THV2, the second lower metal line LM2*b*, and the fourth via BVIA4 may form the voltage path VP, and a voltage applied to the common source line tapping wire CTW may be transmitted to the plate common source line of the upper substrate U_SUB through the voltage path VP. As described above, the plate common source line may be rewired through the second lower metal line LM2*b* and the vias BVIA including the fourth via BVIA4 on the second lower metal line LM2*b*.

A plurality of bit line through-hole vias BLTHV may be arranged in the bit line through-hole via region BLTHV_R. The bit line through-hole vias BLTHV may extend in the vertical direction VD and pass through the upper insulating layer U_IL, an insulating film IL, and the upper substrate U_SUB to be respectively connected to vias BVIA. Bit line through-hole vias BLTHV below the common source line tapping wire CTW may not be connected to the common source line tapping wire CTW, and bit line through-hole vias BLTHV respectively below the bit lines BLa to BLd may be respectively connected to the bit lines BLa to BLd. For example, the bit line BLa may be connected to a source/drain region SD on the lower substrate L_SUB through the metal contact MC1, a bit line through-hole via BLTHV, a via BVIA, the lower metal layers LM0 to LM2, and the lower metal contacts LMC0 to LMC2.

Figure 14:
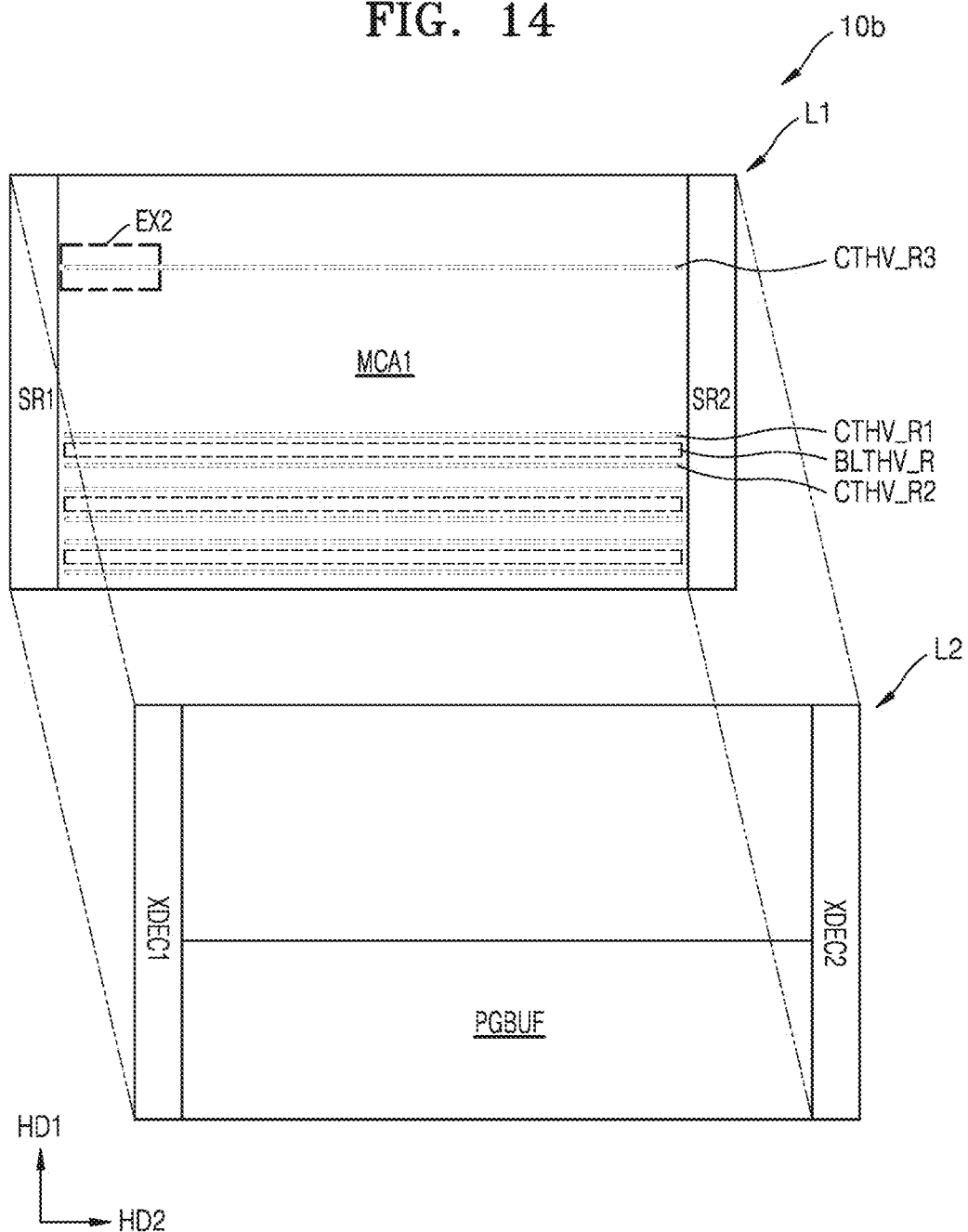
FIG. 14 illustrates a first semiconductor layer and a second semiconductor layer of a memory device, according to an example embodiment.

FIG. 14 illustrates the first semiconductor layer L1 and the second semiconductor layer L2 of a memory device 10*b*, according to an example embodiment. The memory device 10*b* may correspond to a modification of the memory device 10 of FIG. 6. The descriptions given with reference to FIGS. 6 to 13 may also be applied to the present embodiment.

Referring to FIG. 14, the first semiconductor layer L1 may further include a third region CTHV_R3. Here, the third region CTHV_R3 may not correspond to the page buffer region PGBUF of the second semiconductor layer L2. For example, a control logic circuit (e.g., the control logic circuit 230 in FIG. 1) may be arranged in a region of the second semiconductor layer L2, which corresponds to the third region CTHV_R3. However, embodiments are not limited thereto. The first semiconductor layer L1 may include only the third region CTHV_R3 instead of the first and second regions CTHV_R1 and CTHV_R2.

Figure 15:
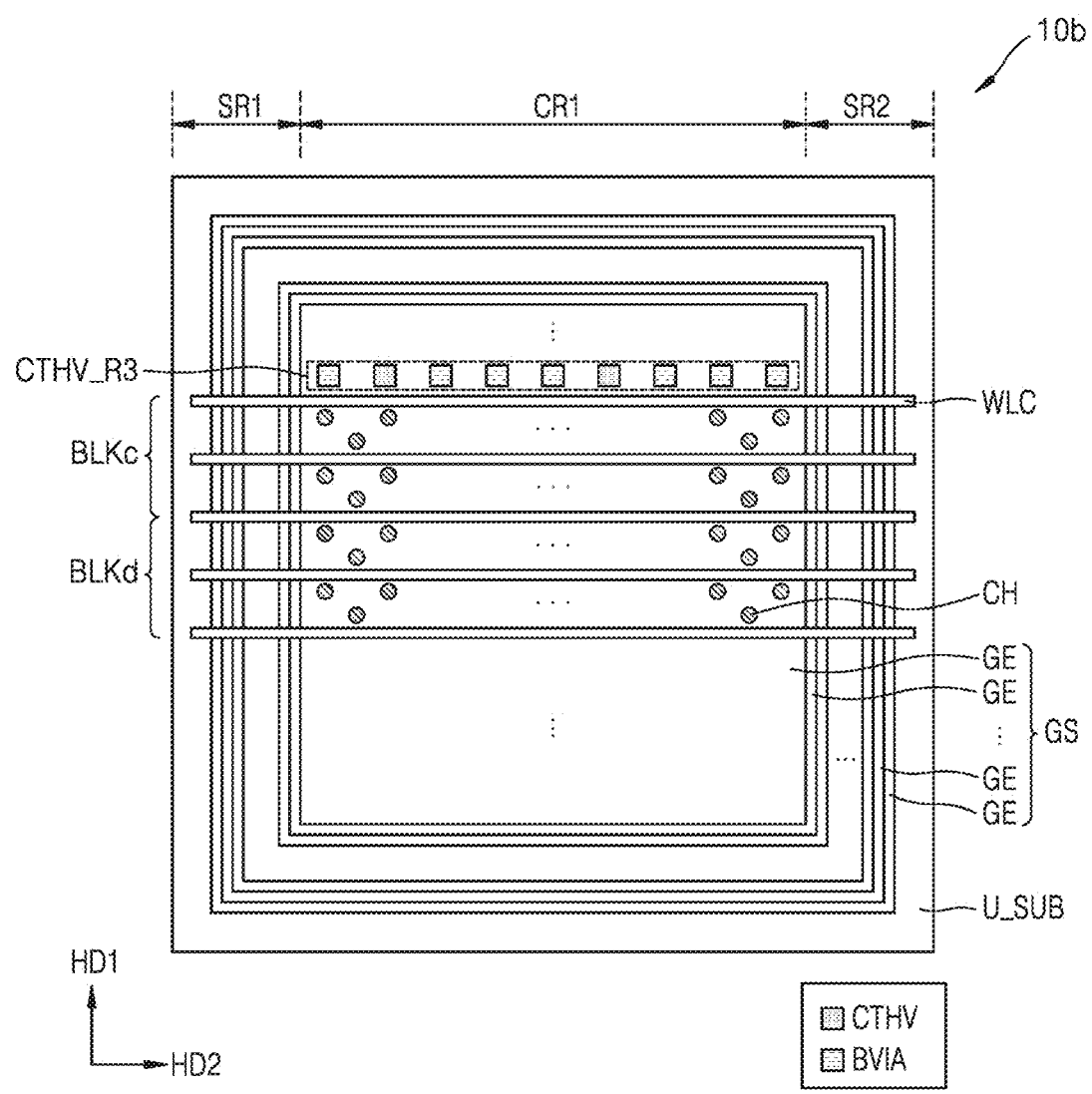
FIG. 15 is a schematic plan view of a portion of a memory device according to an example embodiment.

FIG. 15 is a schematic plan view of a portion of the memory device 10b according to an example embodiment. The memory device 10b may correspond to a modification of the memory device 10a of FIG. 9. The descriptions given with reference to FIG. 9 may also be applied to the present embodiment.

Referring to FIGS. 14 and 15, the memory device 10b may include memory blocks BLKc and BLKd. Each of the memory blocks BLKc and BLKd may include a plurality of channel structures CH. The third region CTHV_R3 may be adjacent to a word line cut structure WLC. A plurality of vias BVIA and through-hole vias CTHV may be below the third region CTHV_R3. This will be described with reference to FIGS. 16 to 19.

Figure 16:
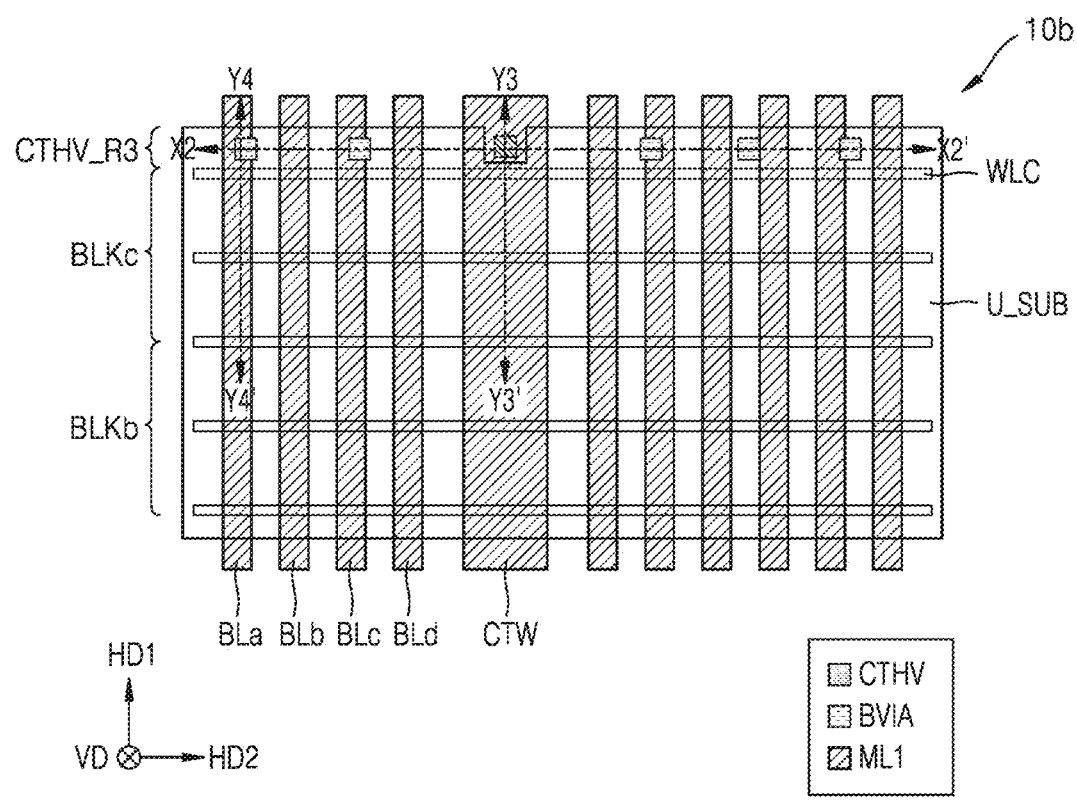
FIG. 16 is a plan view of a portion of the memory device of FIG. 15, according to an example embodiment.
Figure 17:
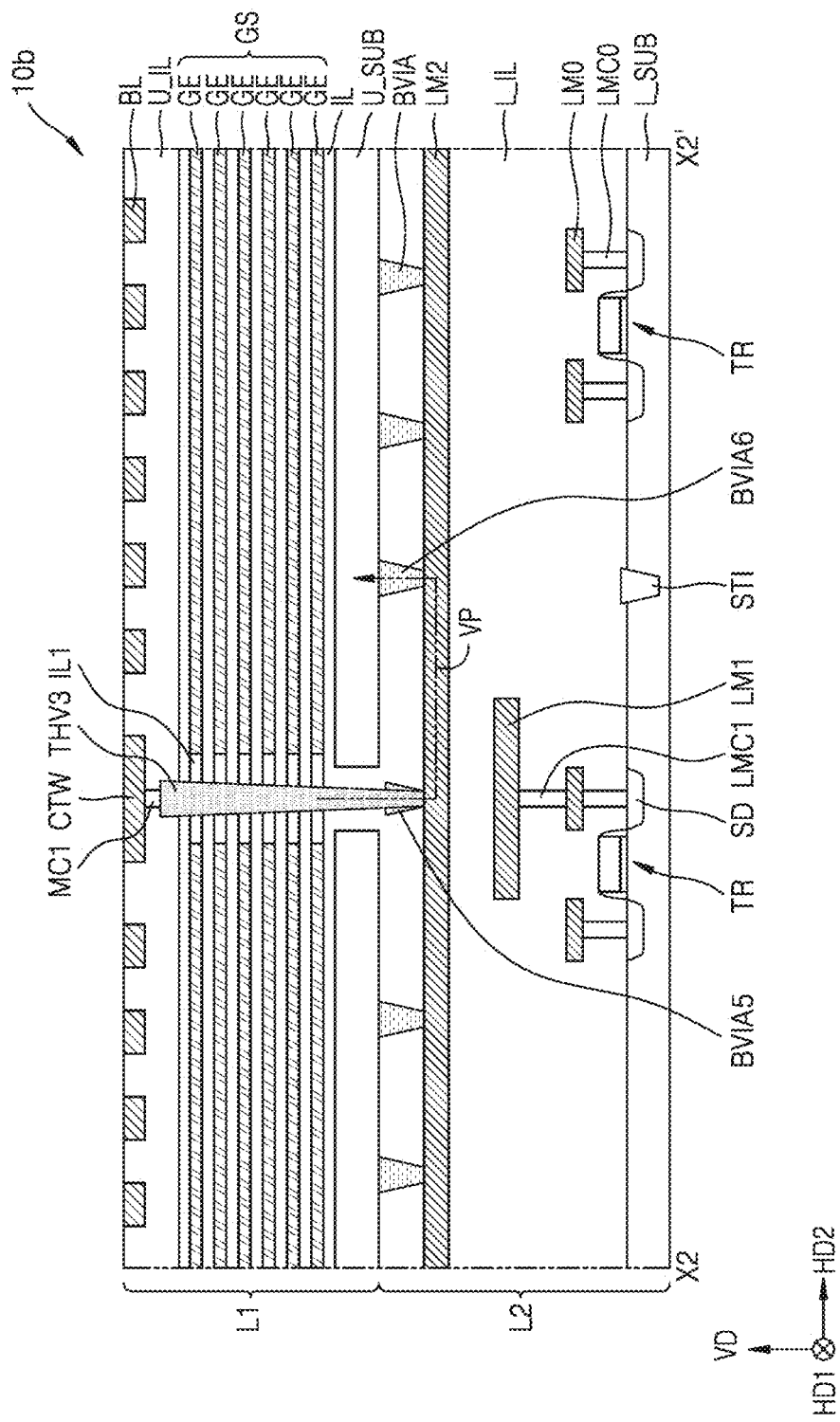
FIG. 17 is a cross-sectional view taken along line X2-X2' in FIG. 16, according to an example embodiment.
Figure 18:
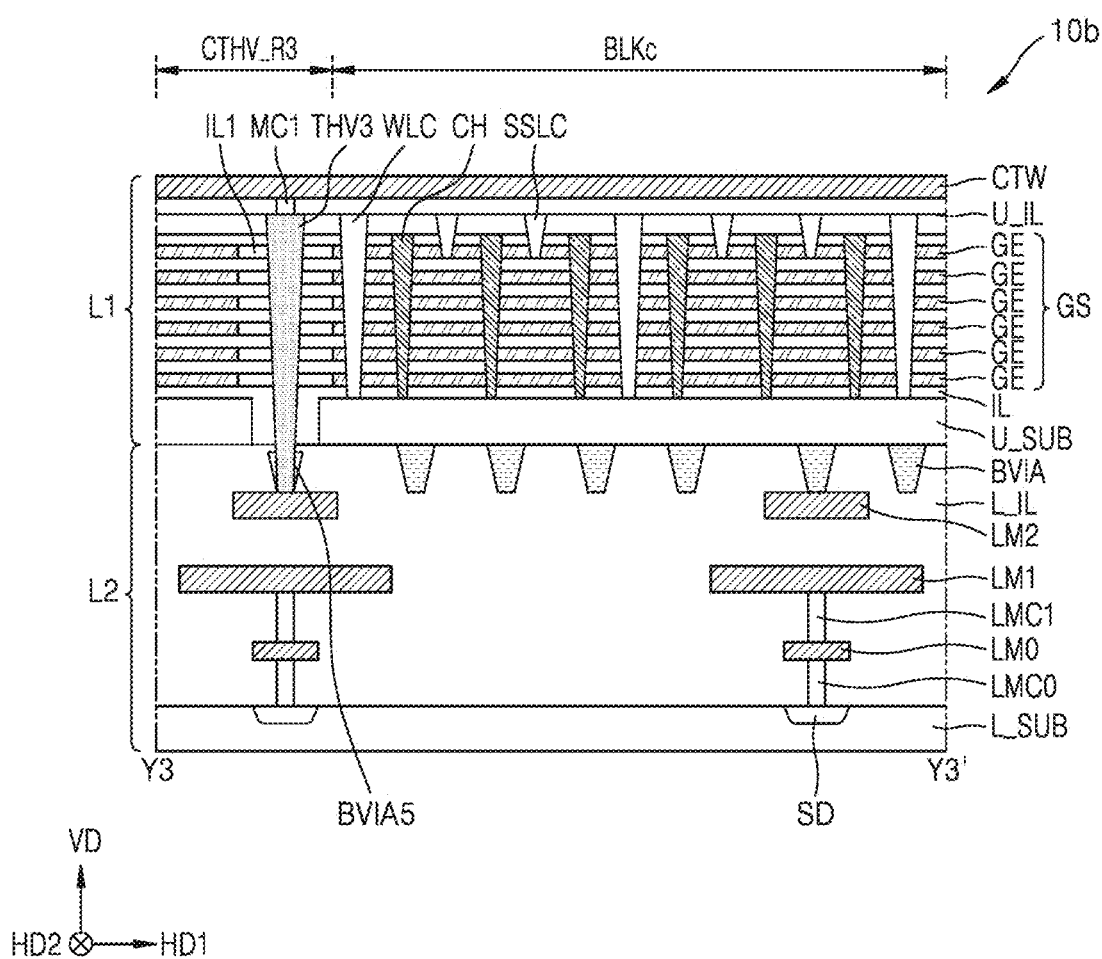
FIG. 18 is a cross-sectional view taken along line Y3-Y3' in FIG. 16, according to an example embodiment.
Figure 19:
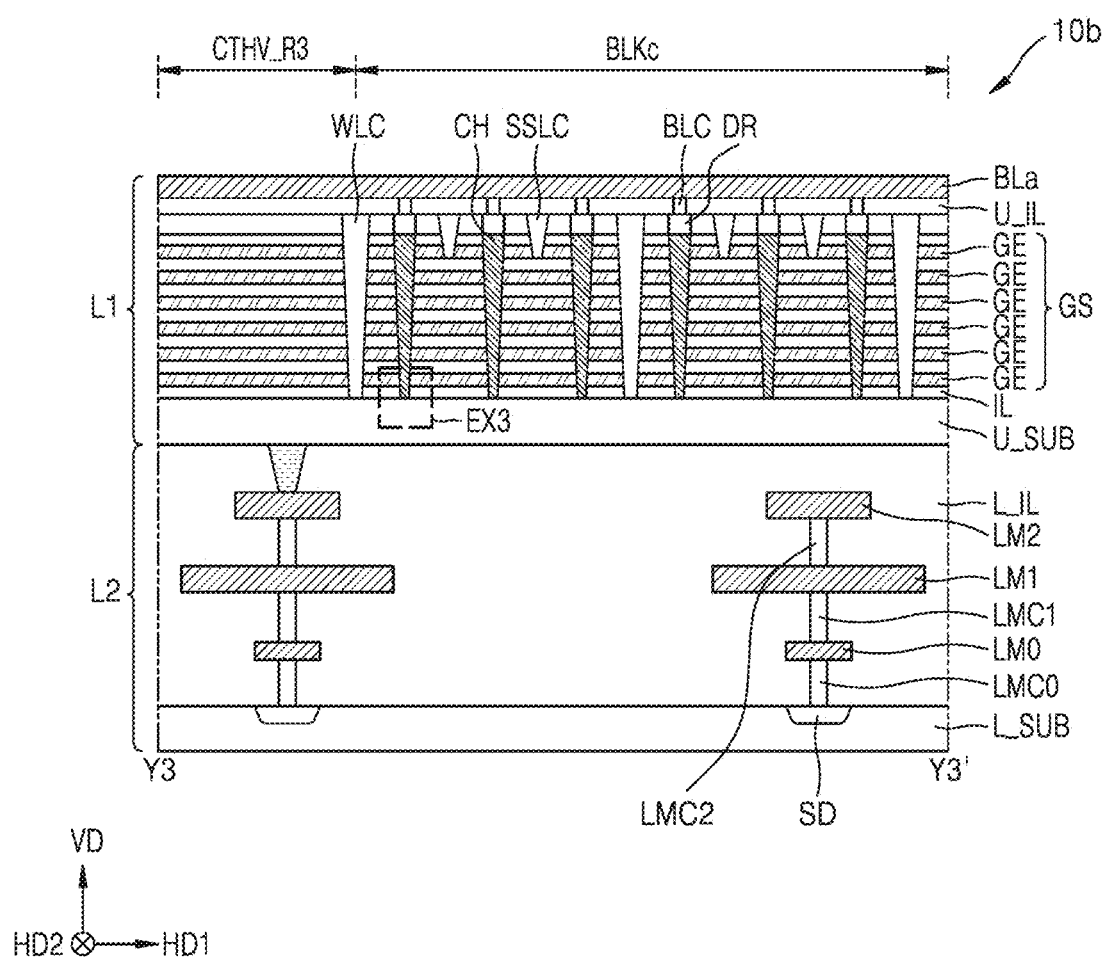
FIG. 19 is a cross-sectional view taken along line Y4-Y4' in FIG. 16, according to an example embodiment.

FIG. 16 is a plan view of a portion of the memory device 10b of FIG. 15, according to an example embodiment. FIG. 17 is a cross-sectional view taken along line X2-X2' in FIG. 16, according to an example embodiment. FIG. 18 is a cross-sectional view taken along line Y3-Y3' in FIG. 16, according to an example embodiment. FIG. 19 is a cross-sectional view taken along line Y4-Y4' in FIG. 16, according to an example embodiment. The descriptions given with reference to FIGS. 10 to 13 may also be applied to the present embodiment, and thus, redundant descriptions thereof are omitted.

Referring to FIGS. 16 to 18, the memory device 10b may include the first and second semiconductor layers L1 and L2 overlapping with each other in the vertical direction VD. The first semiconductor layer L1 may include the upper substrate U_SUB, the gate electrodes GE, the insulating films IL, the channel structures CH, a third through-hole via THV3, the bit lines BL including the bit lines BLa to BLd, the common source line tapping wire CTW, and the upper insulating layer U_IL.

The channel structures CH may extend in the vertical direction VD and pass through the gate electrodes GE and the insulating films IL. For example, the channel structures CH may correspond to the pillars P in FIG. 3A or 3B. The descriptions given with reference to FIGS. 3A and 3B may also be applied to the present embodiments. For example, the channel structures CH may have an annular shape. However, embodiments are not limited thereto. The channel structures CH may have an elliptic pillar shape or a quadrangular pillar shape. The channel structures CH may be separated from each other in the first horizontal direction HD1 and the second horizontal direction HD2. Drains DR may be respectively on the channel structures CH. For example, the drains DR may include a silicon material doped with impurities of the second conductivity type (e.g., the n-type). The bit lines BLa to BLd may be on the drains DR and respectively connected to the drains DR through bit line contacts BLC.

For example, the memory block BLKc may be in a region defined by three adjacent word line cut structures WLC. Two string selection line cut structures SSLC may be between two adjacent word line cut structures WLC. Each of the word line cut structures WLC and the string selection line cut structures SSLC may include an insulating structure. In example embodiments, the insulating structure may include silicon oxide, silicon nitride, silicon oxynitride, or a low-k dielectric material. For example, the insulating structure may include a silicon oxide film, a silicon nitride film, a SiON film, a SiOCN film, a SiCN film, or a combination thereof. In example embodiments, at least a portion of the insulating structure may include an air gap. The term "air" used herein may refer to the atmosphere or other gases that may be present during manufacturing processes.

The third through-hole via THV3 may extend in the vertical direction VD and pass through the gate electrodes GE, the insulating films IL, and the upper substrate U_SUB. The common source line tapping wire CTW may be above the third through-hole via THV3 and connected to the third through-hole via THV3 through a metal contact MC1. The insulating ring IL1 may be around the third through-hole via THV3, and accordingly, the third through-hole via THV3 may be electrically insulated from the gate electrodes GE.

In an example embodiment, the lower metal layer LM2 may be below the third through-hole via THV3 in the vertical direction VD and extend in the second horizontal direction HD2. The third through-hole via THV3 in the third region CTHV_R3 may pass through a fifth via BVIA5 to be connected to the lower metal layer LM2 and may be connected to the upper substrate U_SUB through the vias BVIA including a sixth via BVIA6 on the lower metal layer LM2. Accordingly, the common source line tapping wire CTW may be electrically connected to the upper substrate U_SUB through the metal contact MC1, the third through-hole via THV3, the lower metal layer LM2, and the vias BVIA including the sixth via BVIA6. Here, the third through-hole via THV3, the lower metal layer LM2, and the sixth via BVIA6 may form the voltage path VP, and a voltage applied to the common source line tapping wire CTW may be transmitted to the plate common source line of the upper substrate U_SUB through the voltage path VP. As described above, the plate common source line may be rewired through the lower metal line LM2 and the vias BVIA including the sixth via BVIA6 on the lower metal line LM2.

Figure 20A:
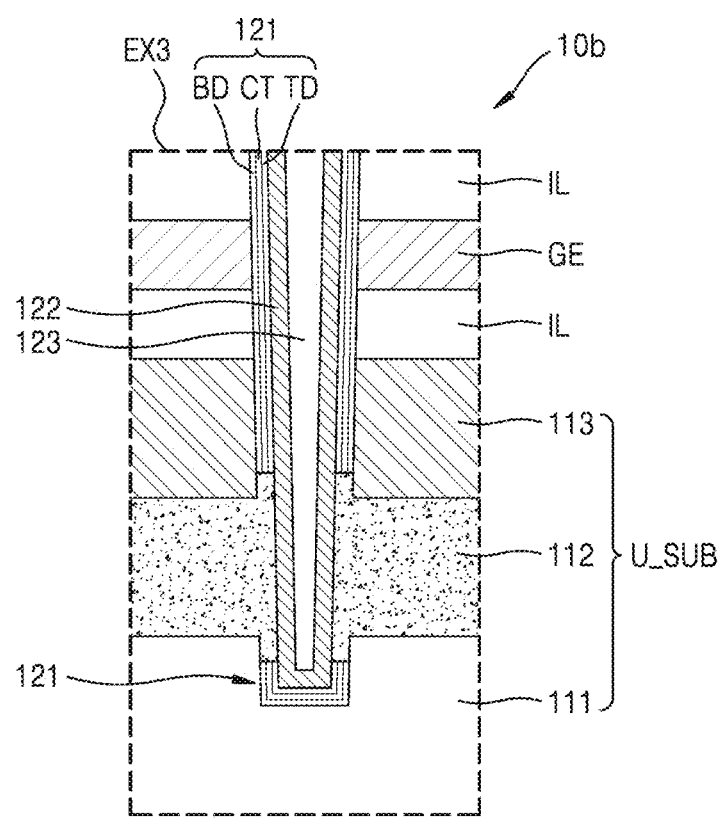
FIG. 20A is an enlarged cross-sectional view of some elements in region EX3 in FIG. 19, according to an example embodiment.

FIG. 20A is an enlarged cross-sectional view of some elements in region EX3 in FIG. 19, according to an example embodiment.

Referring to FIG. 20A, the upper substrate U_SUB may include a substrate 111, a first conductive plate 112, and a second conductive plate 113. The first conductive plate 112 and the second conductive plate 113 may function as the common source line CSL, and accordingly, the upper substrate U_SUB may be defined as including a plate common source line. The substrate 111 may include a semiconductor material such as polysilicon. Each of the first and second conductive plates 112 and 113 may include a doped polysilicon film, a metal film, or a combination thereof. For example, the metal film may include tungsten (W) but is not limited thereto.

A gate dielectric layer 121 may include a tunneling dielectric film TD, a charge trap layer CT, and a blocking dielectric film BD, which are sequentially formed on a channel region 122. The relative thicknesses of the tunneling dielectric film TD, the charge trap layer CT, and the blocking dielectric film BD are not limited to those illustrated in FIG. 20A and may be variously changed. The tunneling dielectric film TD may include silicon oxide, hafnium oxide, aluminum oxide, zirconium oxide, or tantalum oxide. The charge trap layer CT is a region in which electrons transmitted from the channel region 122 through the tunneling dielectric film TD may be stored and may include silicon nitride, boron nitride, silicon boron nitride, or impurity-doped polysilicon.

The blocking dielectric film BD may include silicon oxide, silicon nitride, or metal oxide having a higher permittivity than silicon oxide. The metal oxide may include hafnium oxide, aluminum oxide, zirconium oxide, tantalum oxide, or a combination thereof.

As shown in FIG. 20A, the first conductive plate 112 may pass through a portion of the gate dielectric layer 121 in a horizontal direction to be in contact with the channel region 122. The thickness (i.e., the vertical size) of a portion of the first conductive plate 112, which vertically overlaps with the gate dielectric layer 121, may be greater than the thickness (i.e., the vertical size) of a portion of the first conductive plate 112, which vertically overlaps with the second conductive plate 113. The gate dielectric layer 121 may include a portion, which covers the side wall of the channel region 122 at a higher level in the vertical direction than the first conductive plate 112, and a portion, which covers a lower surface of the channel region 122 at a lower level in the vertical direction than the first conductive plate 112. The channel region 122 may be separated from the substrate 111 with the lowest portion of the gate dielectric layer 121 between the channel region 122 and the substrate 111. The side wall of the channel region 122 may be in contact with the first conductive plate 112 and configured to be electrically connected to the first conductive plate 112.

The channel region 122 may have a cylindrical shape. The channel region 122 may include doped or undoped polysilicon. A buried insulating layer 123 may fill the inner space of the channel region 122. The buried insulating layer 123 may include an insulating material. For example, the buried insulating layer 123 may include silicon oxide, silicon nitride, silicon oxynitride, or a combination thereof. In some embodiments, the buried insulating layer 123 may be omitted. In this case, the channel region 122 may have a pillar shape without an inner space. The gate dielectric layer 121, the channel region 122, and the buried insulating layer 123 may constitute a channel structure CH.

Figure 20B:
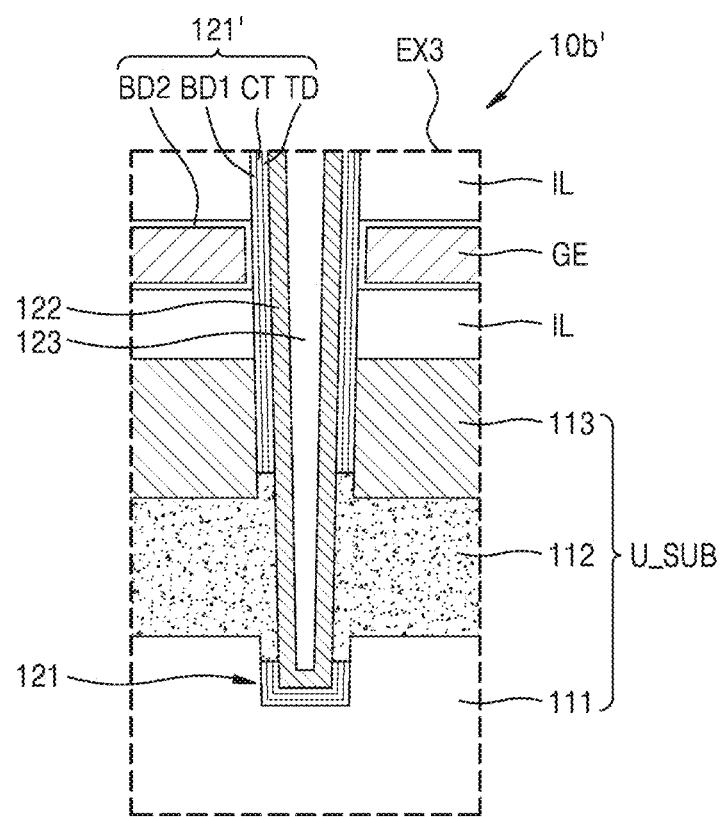
FIG. 20B is an enlarged cross-sectional view of some elements in the region EX3 in FIG. 19, according to an example embodiment.

FIG. 20B is an enlarged cross-sectional view of some elements in the region EX3 in FIG. 19, according to an example embodiment.

Referring to FIG. 20B, a memory device 19b' may have substantially the same configuration as the memory device 10b of FIG. 20A. However, the memory device 10b' may include a gate dielectric layer 121' instead of the gate dielectric layer 121. The gate dielectric layer 121' may have substantially the same configuration as the gate dielectric layer 121 but includes a first blocking dielectric film BD1 and a second blocking dielectric film BD2 instead of the blocking dielectric film BD. The first blocking dielectric film BD1 may extend along the channel region 122, and the second blocking dielectric film BD2 may surround a gate electrode GE. Each of the first and second blocking dielectric films BD1 and BD2 may include silicon oxide, silicon nitride, or metal oxide. For example, the first blocking dielectric film BD1 may include silicon oxide, and the second blocking dielectric film BD2 may include metal oxide having a higher permittivity than the silicon oxide. The metal oxide may include hafnium oxide, aluminum oxide, zirconium oxide, tantalum oxide, or a combination thereof.

Figure 21:
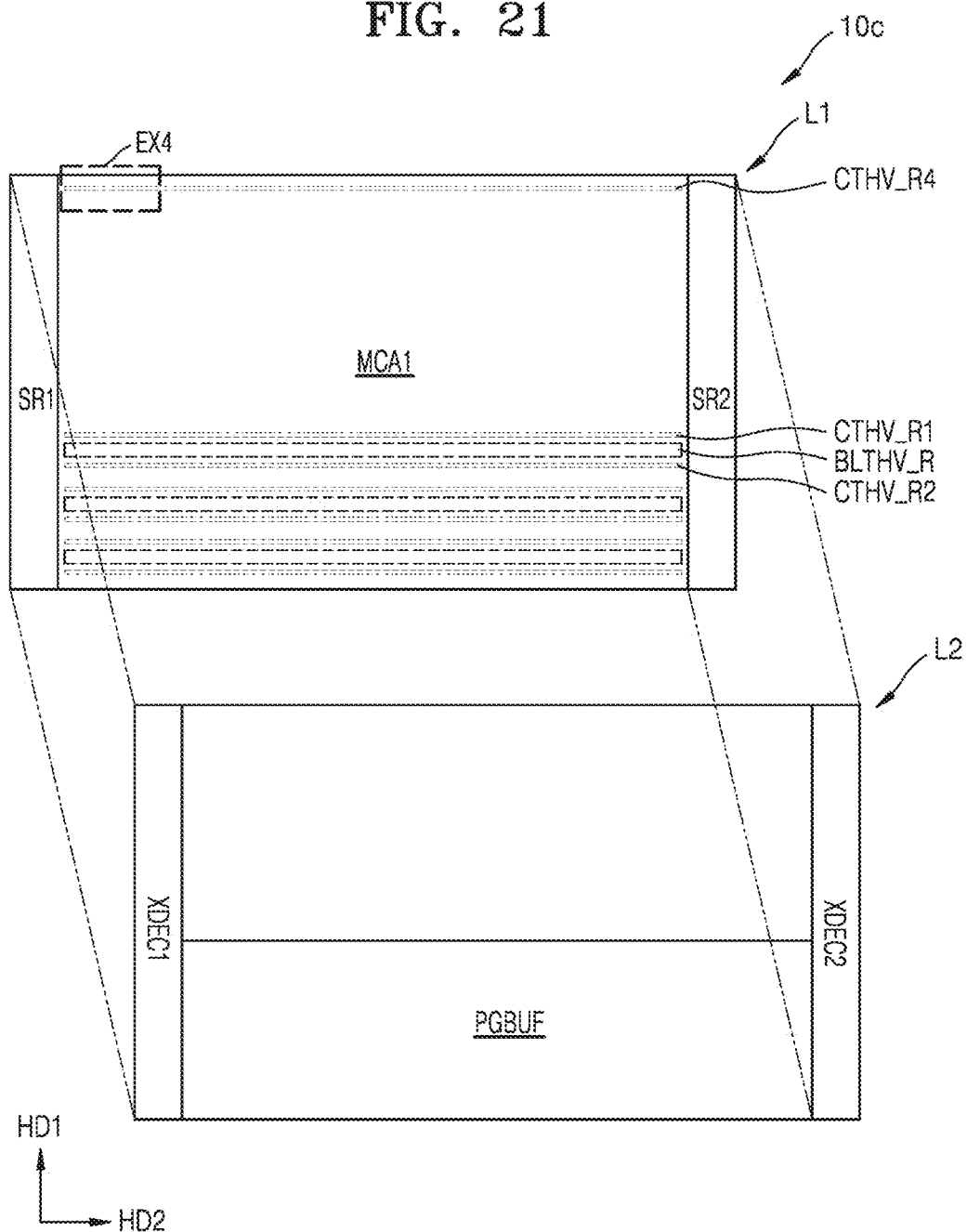
FIG. 21 illustrates a first semiconductor layer and a second semiconductor layer of a memory device, according to an example embodiment.

FIG. 21 illustrates the first semiconductor layer L1 and the second semiconductor layer L2 of a memory device 10c, according to an example embodiment. The memory device 10c may correspond to a modification of the memory device 10 of FIG. 6. The descriptions given with reference to FIGS. 6 to 13 may also be applied to the present embodiment.

Referring to FIG. 21, the first semiconductor layer L1 may further include a fourth region CTHV_R4. Here, the fourth region CTHV_R4 may not correspond to the page buffer region PGBUF of the second semiconductor layer L2. For example, the fourth region CTHV_R4 may be arranged in a top edge region of the first memory cell array MCA1. However, embodiments are not limited thereto. The fourth region CTHV_R4 may be arranged in a bottom edge region of the first memory cell array MCA1. However, embodiments are not limited thereto. The first semiconductor layer L1 may include only the fourth region CTHV_R4 instead of the first and second regions CTHV_R1 and CTHV_R2. In some embodiments, the first semiconductor layer L1 may include the fourth region CTHV_R4 and the third region CTHV_R3 in FIG. 14.

Figure 22:
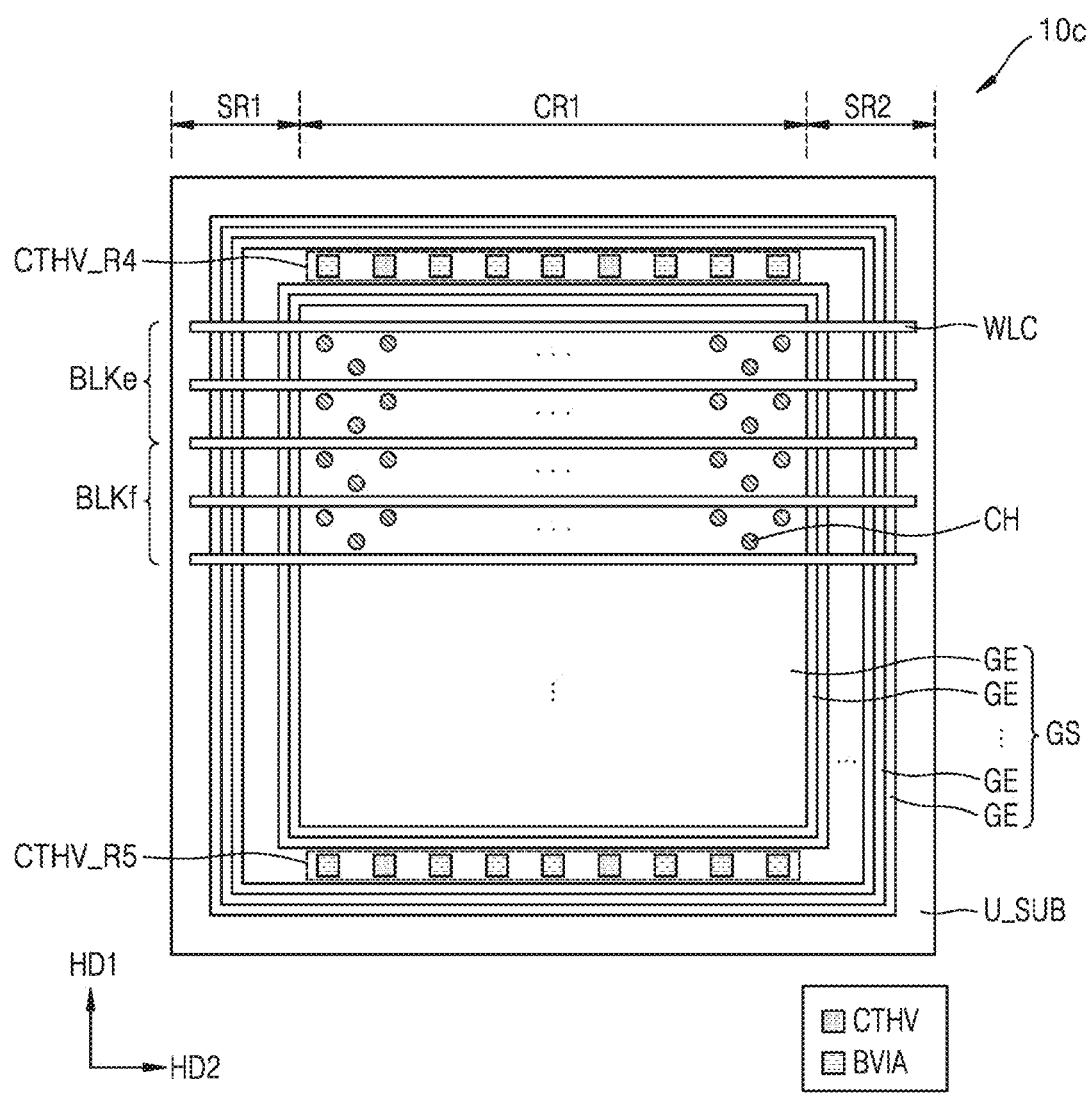
FIG. 22 is a schematic plan view of a portion of a memory device according to an example embodiment.

FIG. 22 is a schematic plan view of a portion of the memory device 10c according to an example embodiment. The memory device 10c may correspond to a modification of the memory device 10a of FIG. 9. The descriptions given with reference to FIG. 9 may also be applied to the present embodiment.

Referring to FIGS. 21 and 22, the memory device 10c may include memory blocks BLKe and BLKf. Each of the memory blocks BLKe and BLKf may include a plurality of channel structures CH. The first semiconductor layer L1 may include the fourth region CTHV_R4 and a fifth region CTHV_R5. Here, the fourth and fifth regions CTHV_R4 and CTHV_R5 may not correspond to the page buffer region PGBUF of the second semiconductor layer L2. For example, the fourth region CTHV_R4 may correspond to a top edge region of the first cell region CR1, i.e., an upper stair region of the gate electrodes GE. The fifth region CTHV_R5 may correspond to a bottom edge region of the first cell region CR1, i.e., a lower stair region of the gate electrodes GE. However, embodiments are not limited thereto. In some embodiments, the memory device 10c may include only one of the fourth and fifth regions CTHV_R4 and CTHV_R5. A plurality of vias BVIA and through-hole vias CTHV may be below the fourth and fifth regions CTHV_R4 and CTHV_R5. This will be described with reference to FIGS. 23 to 26.

Figure 23:
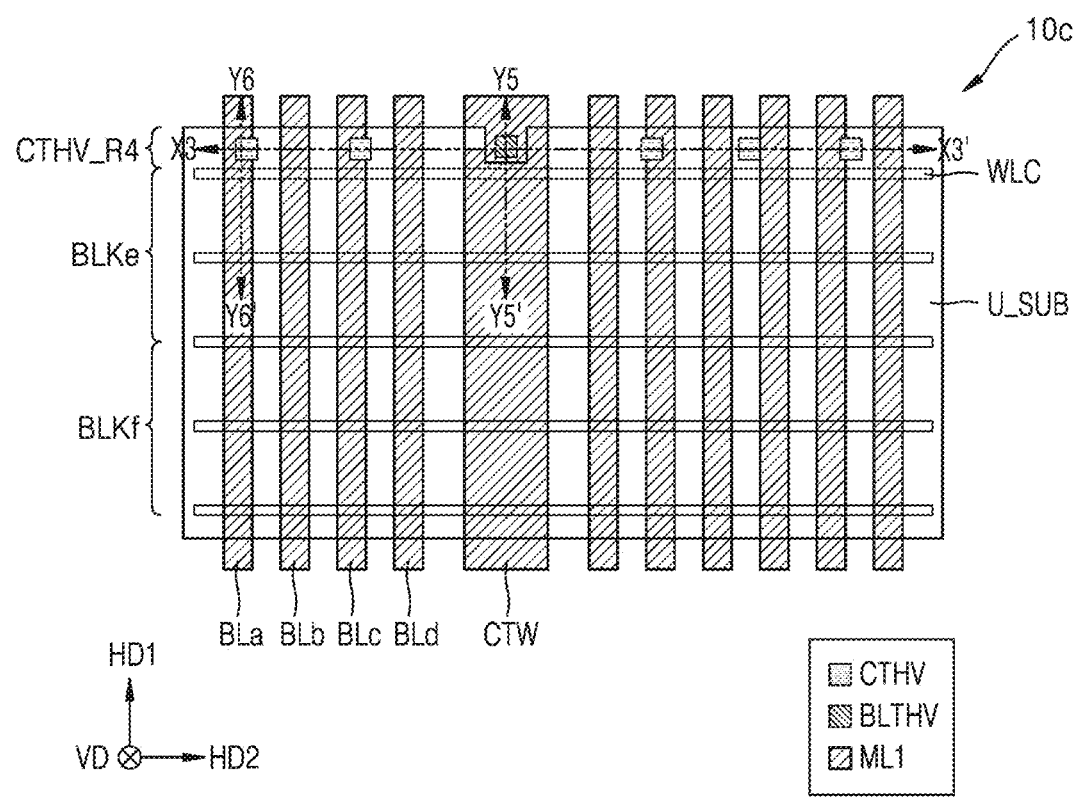
FIG. 23 is a plan view of a portion of the memory device of FIG. 22, according to an example embodiment.
Figure 24:
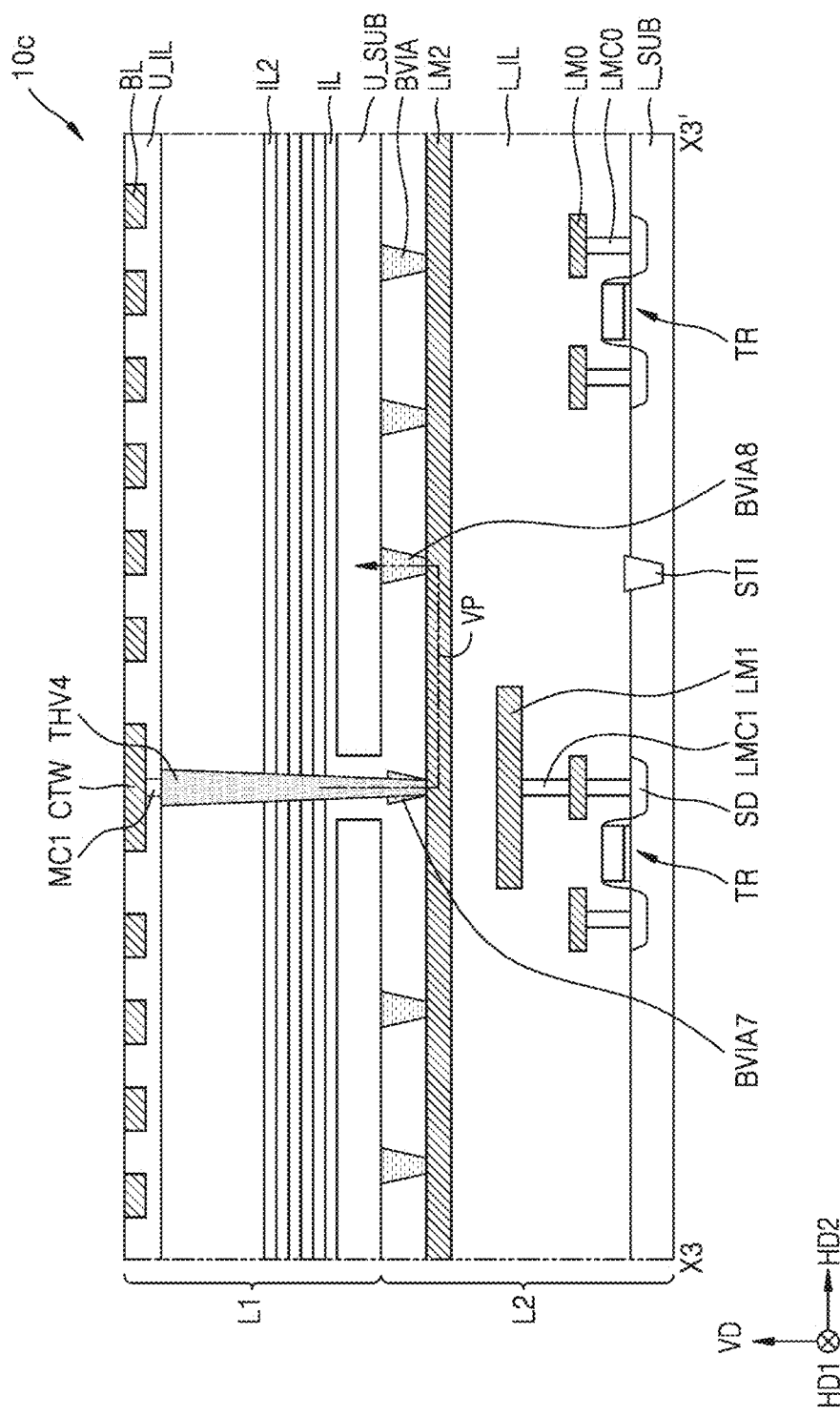
FIG. 24 is a cross-sectional view taken along line X3-X3' in FIG. 23, according to an example embodiment.
Figure 25:
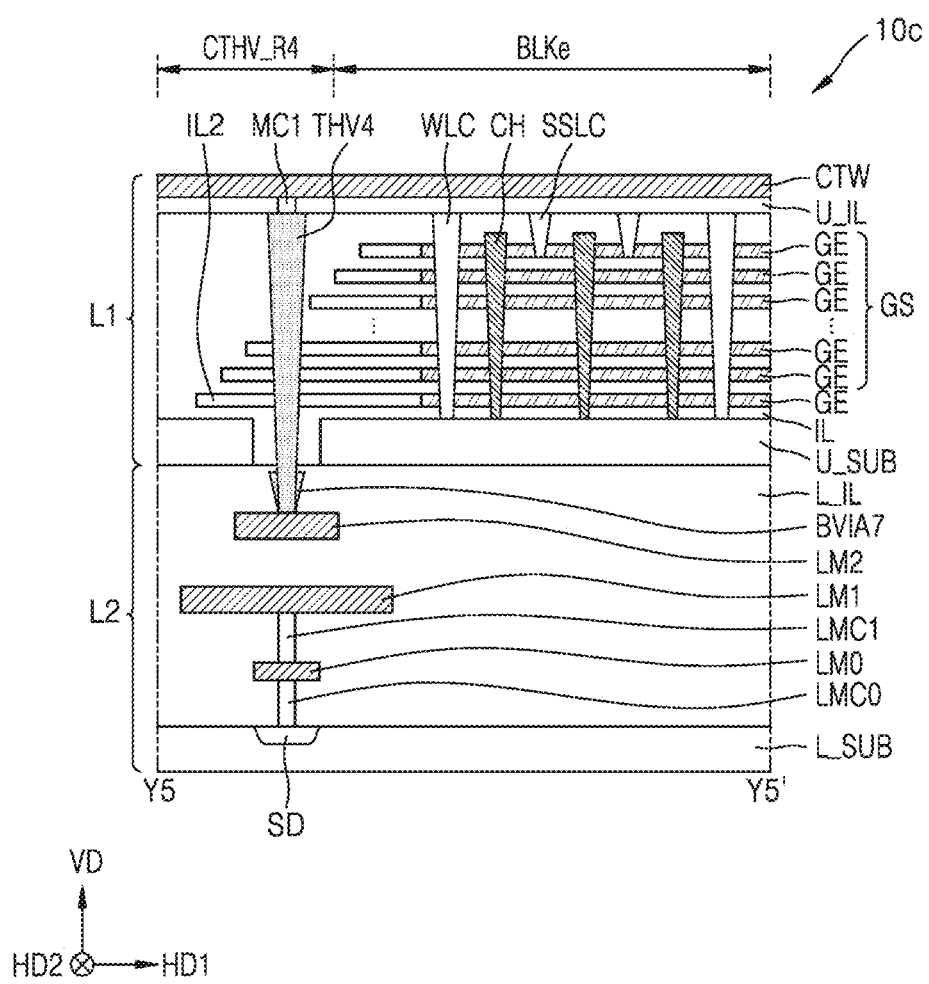
FIG. 25 is a cross-sectional view taken along line Y5-Y5' in FIG. 23, according to an example embodiment.
Figure 26:
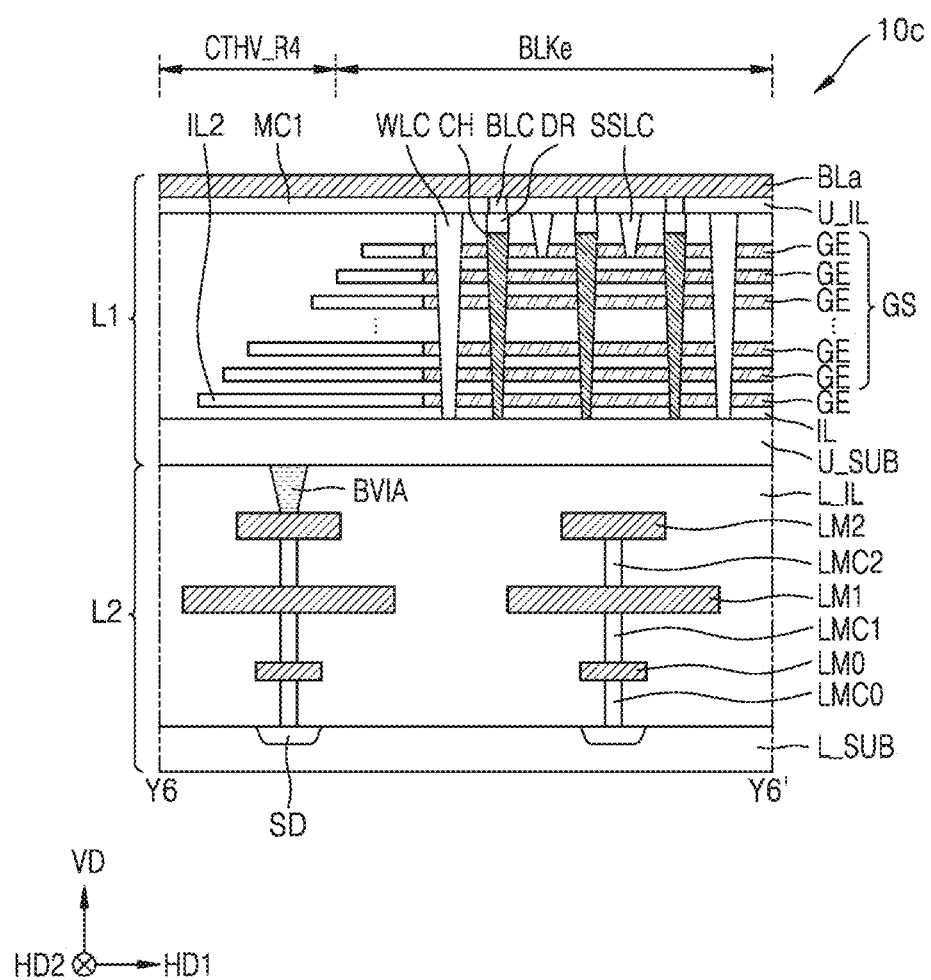
FIG. 26 is a cross-sectional view taken along line Y6-Y6' in FIG. 23, according to an example embodiment.

FIG. 23 is a plan view of a portion of the memory device 10c of FIG. 22, according to an example embodiment. FIG. 24 is a cross-sectional view taken along line X3-X3' in FIG. 23, according to an example embodiment. FIG. 25 is a cross-sectional view taken along line Y5-Y5' in FIG. 23, according to an example embodiment. FIG. 26 is a cross-sectional view taken along line Y6-Y6' in FIG. 23, according to an example embodiment. The descriptions given with reference to FIGS. 10 to 13 and FIGS. 16 to 18 may also be applied to the present embodiment, and thus, redundant descriptions thereof are omitted.

Referring to FIGS. 23 to 26, the memory device 10c may include the first and second semiconductor layers L1 and L2 overlapping with each other in the vertical direction VD. The first semiconductor layer L1 may include the upper substrate U_SUB, the gate electrodes GE, the insulating films IL, the channel structures CH, a fourth through-hole via THV4, the bit lines BL including the bit lines BLa to BLd, the common source line tapping wire CTW, and the upper insulating layer U_IL. For example, the memory block BLKe may be in a region defined by three adjacent word line cut structures WLC. Two string selection line cut structures SSLC may be between two adjacent word line cut structures WLC.

The fourth region CTHV_R4 may include a stack structure of silicon nitride films IL2 and the insulating films IL. For example, the silicon nitride films IL2 may include SiN, and the insulating films IL may include silicon oxide films, and accordingly, the stack structure may be referred to as an ON stack structure. The silicon nitride films IL2 may be at the same levels in the vertical direction as the gate electrodes GE. The fourth through-hole via THV4 may extend in the vertical direction VD and pass through the silicon nitride films IL2, the insulating films IL, and the upper substrate U_SUB. The common source line tapping wire CTW may be above the fourth through-hole via THV4 and connected to the fourth through-hole via THV4 through a metal contact MC1.

In an example embodiment, the lower metal layer LM2 may be below the fourth region CTHV_R4 in the vertical direction VD and extend in the second horizontal direction HD2. The fourth through-hole via THV4 in the fourth region CTHV_R4 may pass through a seventh via BVIA7 to be connected to the lower metal layer LM2 and may be connected to the upper substrate U_SUB through the vias BVIA including an eighth via BVIA8 on the lower metal layer LM2. Accordingly, the common source line tapping wire CTW may be electrically connected to the upper substrate U_SUB through the metal contact MC1, the fourth through-hole via THV4, the lower metal layer LM2, and the vias BVIA including the eighth via BVIA8. Here, the fourth through-hole via THV4, the lower metal layer LM2, and the eighth via BVIA8 may form the voltage path VP, and a voltage applied to the common source line tapping wire CTW may be transmitted to the plate common source line of the upper substrate U_SUB through the voltage path VP. As described above, the plate common source line may be rewired through the lower metal line LM2 and the vias BVIA including the eighth via BVIA8 on the lower metal line LM2.

Figure 27:
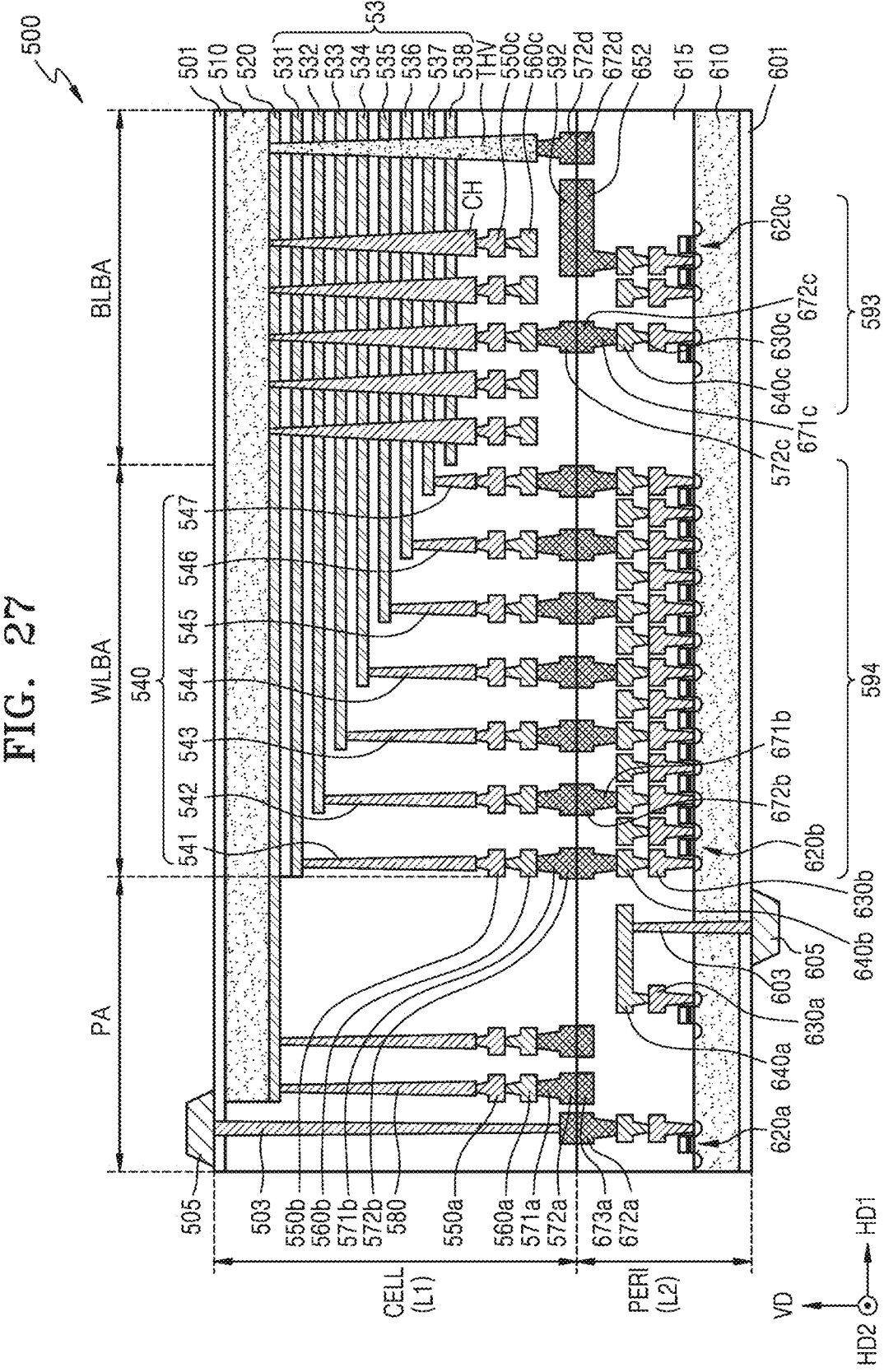
FIG. 27 is a cross-sectional view of a memory device having a bonding vertical NAND (B-VNAND) structure, according to an example embodiment.

FIG. 27 is a cross-sectional view of a memory device having a bonding vertical NAND (B-VNAND) structure, according to an example embodiment. When non-volatile memory of a memory device includes B-VNAND flash memory, the non-volatile memory may have a structure shown in FIG. 27.

Referring to FIG. 27, a cell region CELL of a memory device 500 may correspond to the first semiconductor layer L1, and a peripheral circuit region PERI of the memory device 500 may correspond to the second semiconductor layer L2. Each of the peripheral circuit region PERI and the cell region CELL of the memory device 500 may include an external pad bonding area PA, a word line bonding area WLBA, and a bit line bonding area BLBA.

The peripheral circuit region PERI may include a first substrate 610, an interlayer insulating layer 615, a plurality of circuit elements 620a, 620b, and 620c formed on the first substrate 610, first metal layers 630a, 630b, and 630c respectively connected to the plurality of circuit elements 620a, 620b, and 620c, and second metal layers 640a, 640b, and 640c formed on the first metal layers 630a, 630b, and 630c. In an example embodiment, the first metal layers 630a, 630b, and 630c may be formed of tungsten having relatively high resistivity, and the second metal layers 640a, 640b, and 640c may be formed of copper having relatively low resistivity.

In an example embodiment, although only the first metal layers 630a, 630b, and 630c and the second metal layers 640a, 640b, and 640c are shown and described, the example embodiment is not limited thereto, and one or more additional metal layers may be further formed on the second metal layers 640a, 640b, and 640c. At least a portion of the one or more additional metal layers formed on the second metal layers 640a, 640b, and 640c may be formed of aluminum or the like having a lower resistivity than those of copper forming the second metal layers 640a, 640b, and 640c.

The interlayer insulating layer 615 may be disposed on the first substrate 610 and cover the plurality of circuit elements 620a, 620b, and 620c, the first metal layers 630a, 630b, and 630c, and the second metal layers 640a, 640b, and 640c. The interlayer insulating layer 615 may include an insulating material such as silicon oxide, silicon nitride, or the like.

Lower bonding metals 671b and 672b may be formed on the second metal layer 640b in the word line bonding area WLBA. In the word line bonding area WLBA, the lower bonding metals 671b and 672b in the peripheral circuit region PERI may be electrically bonded to upper bonding metals 571b and 572b of the cell region CELL. The lower bonding metals 671b and 672b and the upper bonding metals 571b and 572b may be formed of aluminum, copper, tungsten, or the like. Further, the upper bonding metals 571b and 572b in the cell region CELL may be referred as first metal pads and the lower bonding metals 5271b and 5272b in the peripheral circuit region PERI may be referred as second metal pads.

The cell region CELL may include at least one memory block. The cell region CELL may include a second substrate 510 and a common source line 520. On the second substrate 510, a plurality of word lines 531 to 538 (i.e., 530) may be stacked in a vertical direction VD, perpendicular to an upper surface of the second substrate 510. At least one string select line and at least one ground select line may be arranged on and below the plurality of word lines 530, respectively, and the plurality of word lines 530 may be disposed between the at least one string select line and the at least one ground select line.

In the bit line bonding area BLBA, a channel structure CH may extend in the vertical direction VD, perpendicular to the upper surface of the second substrate 510, and pass through the plurality of word lines 530, the at least one string select line, and the at least one ground select line. The channel structure CH may include a data storage layer, a channel layer, a buried insulating layer, and the like, and the channel layer may be electrically connected to a first metal layer 550c and a second metal layer 560c. For example, the first metal layer 550c may be a bit line contact, and the second metal layer 560c may be a bit line. In an example embodiment, the bit line 560c may extend in a second horizontal direction HD2, parallel to the upper surface of the second substrate 510.

In an example embodiment, an area in which the channel structure CH, the bit line 560c, and the like are disposed may be defined as the bit line bonding area BLBA. In the bit line bonding area BLBA, the bit line 560c may be electrically connected to the circuit elements 620c providing a page buffer 593 in the peripheral circuit region PERI. The bit line 560c may be connected to upper bonding metals 571c and 572c in the cell region CELL, and the upper bonding metals 571c and 572c may be connected to lower bonding metals 671c and 672c connected to the circuit elements 620c of the page buffer 593.

In an example embodiment, the memory device 500 may further include a through-hole via THV in the bit line bonding area BLBA. The through-hole via THV may pass through the word lines 530 and extend in the vertical direction VD. The through-hole via THV may be connected to the common source line 520 and/or the second substrate 510. Although not shown, an insulating ring may be around the through-hole via THV, and the through-hole via THV may be insulated from the word lines 530. The through-hole via THV may be connected to the peripheral circuit region PERI through an upper bonding metal 572d and a lower bonding metal 672d.

In the word line bonding area WLBA, the plurality of word lines 530 may extend in a first horizontal direction HD1, parallel to the upper surface of the second substrate 510, and may be connected to a plurality of cell contact plugs 541 to 547 (i.e., 540). The plurality of word lines 530 and the plurality of cell contact plugs 540 may be connected to each other in pads provided by at least a portion of the plurality of word lines 530 extending in different lengths in the second horizontal direction HD2. A first metal layer 550b and a second metal layer 560b may be connected to an upper portion of the plurality of cell contact plugs 540 connected to the plurality of word lines 530, sequentially. The plurality of cell contact plugs 540 may be connected to the peripheral circuit region PERI by the upper bonding metals 571b and 572b of the cell region CELL and the lower bonding metals 671b and 672b of the peripheral circuit region PERI in the word line bonding area WLBA.

The plurality of cell contact plugs 540 may be electrically connected to the circuit elements 620b providing a row decoder 594 in the peripheral circuit region PERI. In an example embodiment, operating voltages of the circuit elements 620b of the row decoder 594 may be different than operating voltages of the circuit elements 620c providing the page buffer 593. For example, operating voltages of the circuit elements 620c providing the page buffer 593 may be greater than operating voltages of the circuit elements 620b providing the row decoder 594.

A common source line contact plug 580 may be disposed in the external pad bonding area PA. The common source line contact plug 580 may be formed of a conductive material such as a metal, a metal compound, polysilicon, or the like, and may be electrically connected to the common source line 520. A first metal layer 550a and a second metal layer 560a may be stacked on an upper portion of the common source line contact plug 580, sequentially. For example, an area in which the common source line contact plug 580, the first metal layer 550a, and the second metal layer 560a are disposed may be defined as the external pad bonding area PA.

A first input-output pad 605 and a second input-output pad 505 may be disposed in the external pad bonding area PA. A lower insulating film 601 covering a lower surface of the first substrate 610 may be formed below the first substrate 610, and a first input-output pad 605 may be formed on the lower insulating film 601. The first input-output pad 605 may be connected to at least one of the plurality of circuit elements 620a, 620b, and 620c disposed in the peripheral circuit region PERI through a first input-output contact plug 603, and may be separated from the first substrate 610 by the lower insulating film 601. In addition, a side insulating film may be disposed between the first input-output contact plug 603 and the first substrate 610 to electrically separate the first input-output contact plug 603 and the first substrate 610.

An upper insulating film 501 covering the upper surface of the second substrate 510 may be formed on the second substrate 510, and a second input-output pad 505 may be disposed on the upper insulating layer 501. The second input-output pad 505 may be connected to at least one of the plurality of circuit elements 620a, 620b, and 620c disposed in the peripheral circuit region PERI through a second input-output contact plug 503.

According to embodiments, the second substrate 510 and the common source line 520 may not be disposed in an area in which the second input-output contact plug 503 is disposed. Also, the second input-output pad 505 may not overlap the word lines 530 in the vertical direction VD. The second input-output contact plug 503 may be separated from the second substrate 510 in a direction, parallel to the upper surface of the second substrate 510, and may pass through an interlayer insulating layer of the cell region CELL to be connected to the second input-output pad 505.

According to embodiments, the first input-output pad 605 and the second input-output pad 505 may be selectively formed. For example, the memory device 400 may include only the first input-output pad 605 disposed on the first substrate 610 or the second input-output pad 505 disposed on the second substrate 510. Alternatively, the memory device 400 may include both the first input-output pad 605 and the second input-output pad 505.

A metal pattern provided on an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 500 may include a lower metal pattern 673a, corresponding to an upper metal pattern 572a formed in an uppermost metal layer of the cell region CELL, and having the same cross-sectional shape as the upper metal pattern 572a of the cell region CELL so as to be connected to each other, in an uppermost metal layer of the peripheral circuit region PERI. In the peripheral circuit region PERI, the lower metal pattern 673a formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 671b and 672b may be formed on the second metal layer 640b in the word line bonding area WLBA. In the word line bonding area WLBA, the lower bonding metals 671b and 672b of the peripheral circuit region PERI may be electrically connected to the upper bonding metals 571b and 572b of the cell region CELL by a Cu-to-Cu bonding.

Further, in the bit line bonding area BLBA, an upper metal pattern 592, corresponding to a lower metal pattern 652 formed in the uppermost metal layer of the peripheral circuit region PERI, and having the same cross-sectional shape as the lower metal pattern 652, may be formed in an uppermost metal layer of the cell region CELL. A contact may not be formed on the upper metal pattern 592 formed in the uppermost metal layer of the cell region CELL.

Figure 28:
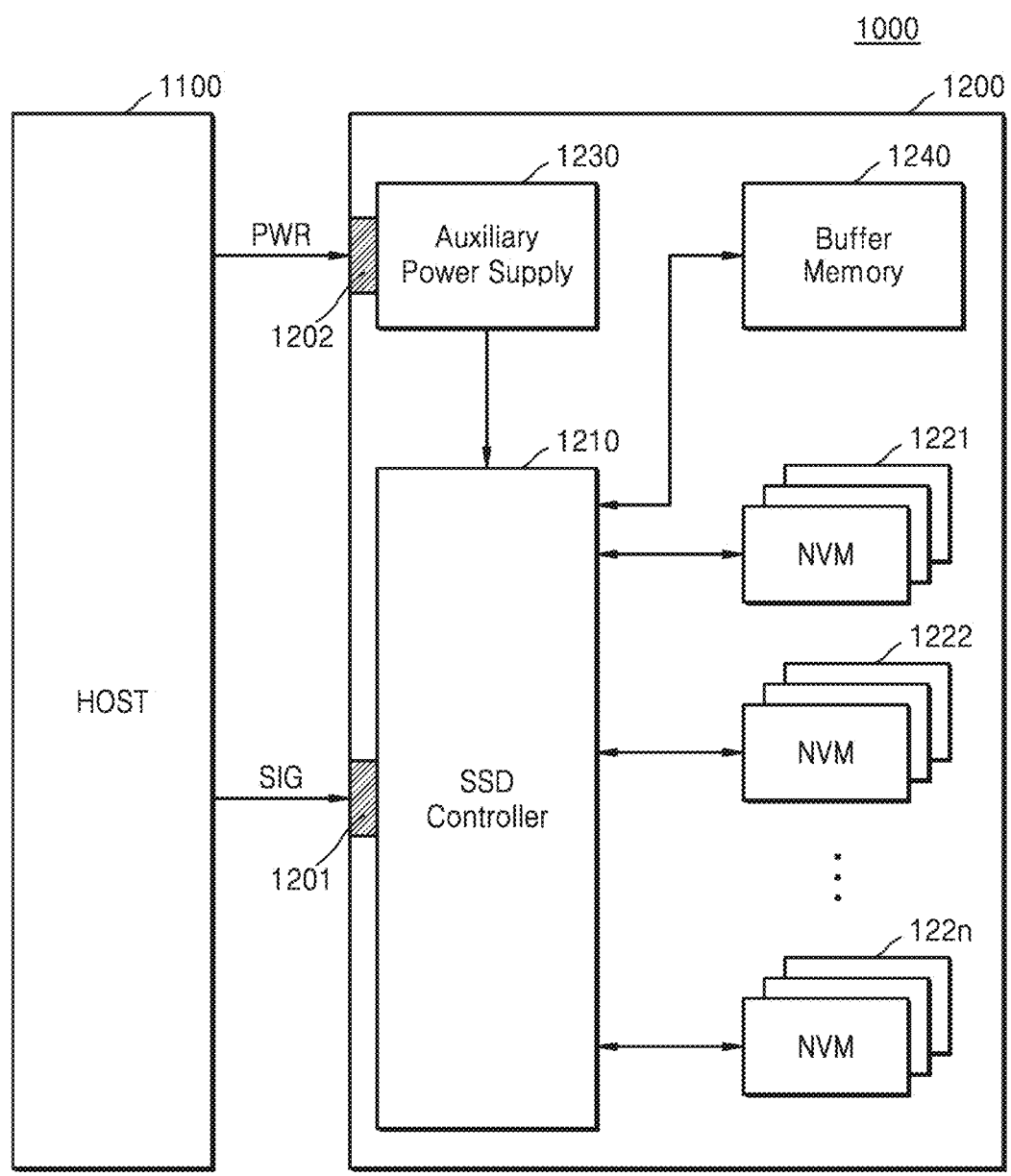
FIG. 28 is a block diagram of a solid state drive (SSD) system using a memory device according to an example embodiment.

FIG. 28 is a block diagram of a solid state drive (SSD) system 1000 using a memory device according to an example embodiment.

Referring to FIG. 28, the SSD system 1000 may include a host 1100 and an SSD 1200. The SSD 1200 may exchange signals SIG with the host 1100 through a signal connector 1201 and may receive power PWR through a power connector 1202. The SSD 1200 may include an SSD controller 1210, an auxiliary power supply 1230, a buffer memory 1240, and memory devices 1221, 1222, and 122n. The memory devices 1221, 1222, and 122n may include a vertical stack NAND flash memory device. Here, the SSD 1200 may be realized using the embodiments described above with reference to FIGS. 1 to 27.

Additionally, the memory device 10, host 1100, and SSD 1200 and/or the components included therein may include processing circuitry such as hardware including logic circuits; a hardware/software combination such as a processor executing software; or a combination thereof. For example, the processing circuitry may include, but is not limited to, a central processing unit (CPU), a memory controller, an arithmetic logic unit (ALU), a digital signal processor, a microcomputer, a field programmable gate array (FPGA), and programmable logic unit, a microprocessor, application-specific integrated circuit (ASIC), etc.

While the inventive concepts have been particularly shown and described with reference to embodiments thereof, it will be understood that various changes in form and details may be made therein without departing from the spirit and scope of the following claims.

What is claimed is:

1. A non-volatile memory device comprising:
a memory cell region including an upper substrate, channel structures, and a first upper metal line, the channel structure extending in a vertical direction on the upper substrate, the first upper metal line extending in a first horizontal direction above the channel structures; and
a peripheral circuit region below the memory cell region in the vertical direction, the peripheral circuit region including a first lower metal line extending in a second horizontal direction, a first via structure on the first lower metal line, and a second via structure on the first lower metal line, a top surface of the second via structure being in contact with the upper substrate,
wherein the memory cell region further includes a first through-hole via structure, the first through-hole via structure extending in the vertical direction, the first through-hole via structure passing through the upper substrate and the first via structure, and the first through-hole via structure electrically connecting the first upper metal line to the first lower metal line, and
wherein the first upper metal line is electrically connected to the upper substrate through the first through-hole via structure, the first lower metal line, and the second via structure.

2. The non-volatile memory device of claim 1, wherein the upper substrate includes a plate common source line.

3. The non-volatile memory device of claim 1, wherein the first upper metal line corresponds to a common source line tapping wire.

4. The non-volatile memory device of claim 1, wherein the first horizontal direction is perpendicular to the second horizontal direction.

5. The non-volatile memory device of claim 1, wherein the memory cell region further includes:
a plurality of bit lines at a same level in the vertical direction as the first upper metal line and extending in the first horizontal direction; and
bit line through-hole via structures in a bit line through-hole via region extending in the second horizontal direction, the bit line through-hole via structures respectively electrically connecting the plurality of bit lines to the peripheral circuit region.

6. The non-volatile memory device of claim 1, wherein the first through-hole via structure is adjacent to a word line cut structure in the first horizontal direction, and
the peripheral circuit region further includes a control logic circuit below the word line cut structure and the first through-hole via structure in the vertical direction.

7. The non-volatile memory device of claim 1, wherein the first through-hole via structure is between a top edge of the upper substrate and a word line cut structure adjacent to the top edge of the upper substrate.

8. The non-volatile memory device of claim 1, wherein the first through-hole via structure is between a bottom edge of the upper substrate and a word line cut structure adjacent to the bottom edge of the upper substrate.

9. The non-volatile memory device of claim 1, wherein the upper substrate includes polysilicon including an impurity-doped region, and
the impurity-doped region corresponds to a plate common source line.

10. The non-volatile memory device of claim 1, wherein the upper substrate includes a polysilicon, a first conductive plate, and a second conductive plate that are sequentially stacked, and
the first and second conductive plates correspond to a plate common source line.

11. A non-volatile memory device comprising:
a first semiconductor layer including a plate common source line, channel structures, a common source line tapping wire, and a first through-hole via structure, the channel structures extending in a vertical direction on the plate common source line, the common source line tapping wire extending in a first horizontal direction on the channel structures, the first through-hole via structure passing through the plate common source line and extending in the vertical direction; and
a second semiconductor layer below the first semiconductor layer in the vertical direction, the second semiconductor layer including a lower substrate, circuit elements on the lower substrate, a plurality of lower metal layers connected to the circuit elements, and a plurality of via structures on a first lower metal layer adjacent to the first semiconductor layer among the plurality of lower metal layers, the first lower metal layer extending in a second horizontal direction,
wherein the first through-hole via structure electrically connects the common source line tapping wire to the first lower metal layer, and
the common source line tapping wire is electrically connected to the plate common source line through the first through-hole via structure, the first lower metal layer, and the plurality of via structures.

12. The non-volatile memory device of claim 11, wherein the first semiconductor layer further includes:
a plurality of bit lines at a same level in the vertical direction as the common source line tapping wire and extending in the first horizontal direction; and
bit line through-hole via structures in a bit line through-hole via region extending in the second horizontal direction, the bit line through-hole via structures respectively electrically connecting the plurality of bit lines to a peripheral circuit region.

13. The non-volatile memory device of claim 12, wherein the second semiconductor layer further includes a page buffer below the bit line through-hole via region in the vertical direction, and
the bit line through-hole via structures electrically connect the plurality of bit lines to the page buffer.

14. The non-volatile memory device of claim 12, wherein the first through-hole via structure is adjacent to the bit line through-hole via region in the first horizontal direction.

15. The non-volatile memory device of claim 11, wherein the first through-hole via structure is adjacent to a word line cut structure in the first horizontal direction, and the second semiconductor layer further includes a control logic circuit below the word line cut structure and the first through-hole via structure in the vertical direction.

16. A non-volatile memory device comprising:
a first semiconductor layer including a first memory block, a second memory block, a first through-hole via region adjacent to the first memory block, a bit line through-hole via region adjacent to the first through-hole via region, and a second through-hole via region between the bit line through-hole via region and the second memory block; and
a second semiconductor layer below the first semiconductor layer in a vertical direction, the second semiconductor layer including a first lower metal line and a second lower metal line separated from the first lower metal line in a first horizontal direction,
wherein the first through-hole via region includes a first through-hole via structure connecting a first upper metal line to the first lower metal line, the first upper metal line being above the first and second memory blocks and extending in the first horizontal direction, and
the second through-hole via region includes a second through-hole via structure connecting the first upper metal line to the second lower metal line.

17. The non-volatile memory device of claim 16, wherein the first semiconductor layer further includes a plate common source line, the second semiconductor layer further includes a first via structure on the first lower metal line and a second via structure on the second lower metal line,
the first upper metal line is electrically connected to the plate common source line through the first through-hole via structure, the first lower metal line, and the first via structure, and
the first upper metal line is electrically connected to the plate common source line through the second through-hole via structure, the second lower metal line, and the second via structure.

18. The non-volatile memory device of claim 16, wherein the first semiconductor layer further includes a plurality of bit lines at a same level in the vertical direction as the first upper metal line, and
the bit line through-hole via region includes bit line through-hole via structures connecting the plurality of bit lines to the second semiconductor layer.

19. The non-volatile memory device of claim 18, wherein each of the first and second memory blocks includes channel structures extending in the vertical direction and connected to the plurality of bit lines.

20. The non-volatile memory device of claim 16, wherein the first and second lower metal lines are at a same level in the vertical direction as each other and extend in a second horizontal direction that is perpendicular to the first horizontal direction.

* * * * *